(12) United States Patent
Tanaka et al.

(10) Patent No.: US 12,061,415 B2
(45) Date of Patent: Aug. 13, 2024

(54) METHOD FOR PRODUCING RADIATION-SENSITIVE RESIN COMPOSITION AND PATTERN FORMING METHOD

(71) Applicant: FUJIFILM Corporation, Tokyo (JP)

(72) Inventors: Takumi Tanaka, Haibara-gun (JP); Takashi Bannai, Haibara-gun (JP); Takamitsu Tomiga, Haibara-gun (JP); Kohei Higashi, Haibara-gun (JP); Fumihiro Yoshino, Haibara-gun (JP); Yuma Kurumisawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/902,202

(22) Filed: Sep. 2, 2022

(65) Prior Publication Data
US 2023/0099422 A1 Mar. 30, 2023

Related U.S. Application Data

(63) Continuation of application No. PCT/JP2021/007199, filed on Feb. 25, 2021.

(30) Foreign Application Priority Data

Mar. 26, 2020 (JP) ................................. 2020-055609

(51) Int. Cl.
*G03F 7/00* (2006.01)
*G03F 7/028* (2006.01)
(52) U.S. Cl.
CPC ............ *G03F 7/0035* (2013.01); *G03F 7/028* (2013.01)
(58) Field of Classification Search
CPC ........ B01F 27/15; B01F 27/117; B01F 27/80; B01F 27/0726
See application file for complete search history.

(56) References Cited

U.S. PATENT DOCUMENTS 5,037,209 A 8/1991 Wyss
5,156,788 A * 10/1992 Chesterfield ..... A61B 17/06004
604/905
(Continued)

FOREIGN PATENT DOCUMENTS

GB 749327 A * 5/1956
JP 2004-513776 A 5/2004
(Continued)

OTHER PUBLICATIONS

International Search Report dated May 18, 2021 issued by the International Searching Authority in Application No. PCT/JP2021/007199.
(Continued)

*Primary Examiner* — Martin J Angebranndt
(74) *Attorney, Agent, or Firm* — Sughrue Mion, PLLC

(57) ABSTRACT

A method for producing a composition, the method being for producing a composition using a stirring device provided with a stirring tank and a stirrer, includes a mixing step of charging a resin, an acid generator, and a solvent into the stirring tank, and a stirring step of stirring the mixture accommodated in the stirring tank, using the stirrer, in which a ratio c of a content of the acid generator to a total mass of the mixture is 0.3% to 2.5% by mass, the stirrer is provided with a rotatable stirring shaft, a plurality of support parts attached to the stirring shaft, and a plurality of stirring elements attached to each of end parts of the plurality of support parts, the shape and the arrangement of the stirring elements are specified, and the positions of the plurality of stirring elements are specified so as to satisfy a specific Expression (1).

6 Claims, 2 Drawing Sheets

(56) References Cited

U.S. PATENT DOCUMENTS

| | | | | |
|---|---|---|---|---|
| 6,379,558 B1 * | 4/2002 | Ogawa | ................. | G03F 7/3092 |
| | | | | 210/710 |
| 8,876,369 B1 * | 11/2014 | Lott | ..................... | B01F 27/117 |
| | | | | 366/328.2 |
| 2004/0037163 A1 | 2/2004 | Weber | | |
| 2004/0209000 A1 * | 10/2004 | Curtiss | ............... | H01L 21/6715 |
| | | | | 427/430.1 |
| 2009/0059138 A1 * | 3/2009 | Matsumoto | ........... | C09B 57/004 |
| | | | | 522/74 |
| 2011/0249529 A1 * | 10/2011 | Hirzel | ................ | B01F 27/0726 |
| | | | | 366/343 |
| 2018/0236419 A1 | 8/2018 | Blömer et al. | | |

FOREIGN PATENT DOCUMENTS

| | | | | | |
|---|---|---|---|---|---|
| JP | 2010053294 A | * | 3/2010 | | |
| JP | 2018-527175 A | | 9/2018 | | |
| JP | 2019-120766 A | | 7/2019 | | |
| WO | WO-2015007704 A1 | * | 1/2015 | ........ | B01L 3/502761 |
| WO | WO-2018029142 A1 | * | 2/2018 | ........... | G03F 7/0045 |

OTHER PUBLICATIONS

Written Opinion dated May 18, 2021 issued by the International Searching Authority in Application No. PCT/JP2021/007199.
International Preliminary Report on Patentability dated Sep. 22, 2022 with a Translation of the Written Opinion of the International Searching Authority in Application No. PCT/JP2021/007199.

* cited by examiner

US 12,061,415 B2

METHOD FOR PRODUCING RADIATION-SENSITIVE RESIN COMPOSITION AND PATTERN FORMING METHOD

CROSS-REFERENCE TO RELATED APPLICATIONS

This application is a Continuation of PCT International Application No. PCT/JP2021/007199 filed on Feb. 25, 2021, which claims priority under 35 U.S.C § 119(a) to Japanese Patent Application No. 2020-055609 filed on Mar. 26, 2020. Each of the above application(s) is hereby expressly incorporated by reference, in its entirety, into the present application.

BACKGROUND OF THE INVENTION

1. Field of the Invention

The present invention relates to a method for producing a radiation-sensitive resin composition and a pattern forming method.

2. Description of the Related Art

In processes for manufacturing semiconductor devices such as an integrated circuit (IC) and a large scale integrated circuit (LSI), microfabrication by lithography using a radiation-sensitive resin composition has been performed.

Examples of the lithographic method include a method in which a resist film is formed with a radiation-sensitive resin composition, and then the obtained film is exposed and then developed.

JP2019-120766A discloses an invention relating to a resist pattern forming method including a step (i) of forming a resist film having a film thickness of 7 μm or more on a support, using a resist composition, a step (ii) of exposing the resist film, and a step (iii) of developing the resist film after the exposure to form a resist pattern, in which the resist composition contains a substrate component (A) having a solubility in a developer that changes by the action of an acid, and a specific acid generator (B1); and the like.

SUMMARY OF THE INVENTION

On the other hand, in the formation of a pattern (resist pattern) using a radiation-sensitive resin composition, it is desirable that there are fewer defects in a pattern thus formed. Furthermore, in the present specification, a defect means, for example, that a pattern obtained by carrying out a development treatment has a dent or a chip, and the pattern does not have a predetermined size.

The radiation-sensitive resin composition is often used after being stored for a predetermined period of time.

Therefore, the present inventors have produced a radiation-sensitive resin composition using a predetermined stirring device with reference to JP2019-120766A, and have examined characteristics of the radiation-sensitive resin composition. In this regard, the present inventors have found that generation of defects was observed in a pattern formed using the radiation-sensitive resin composition after a long-term storage, and there was thus room for further improvement.

An object of the present invention is to provide a method for producing a radiation-sensitive resin composition, whereby a radiation-sensitive resin composition having suppressed generation of defects in a pattern thus formed even after a long-term storage is produced.

In addition, another object of the present invention is to provide a pattern forming method.

The present inventors have found that the objects can be accomplished by the following configurations.

[1] A method for producing a radiation-sensitive resin composition, the method being for producing a radiation-sensitive resin composition using a stirring device provided with a stirring tank and a stirrer, comprising:
  a mixing step of charging a resin, an acid generator, and a solvent into the stirring tank to obtain a mixture including the resin, the acid generator, and the solvent; and
  a stirring step of stirring the mixture accommodated in the stirring tank, using the stirrer,
  in which a ratio c of a content of the acid generator to a total mass of the mixture is 0.3% to 2.5% by mass,
  the stirrer is provided with a rotatable stirring shaft, a plurality of support parts attached to the stirring shaft, and a plurality of stirring elements attached to each of end parts of the plurality of support parts,
  the stirring element consists of a tubular body having a first opening portion and a second opening portion facing each other,
  an opening area of the first opening portion is wider than an opening area of the second opening portion,
  the stirring element is arranged such that a direction from the second opening portion to the first opening portion coincides with a rotation direction of the stirring shaft,
  a central axis of the tubular body is inclined with respect to a plane orthogonal to the stirring shaft, and
  the stirrer satisfies a specific Expression (1).

[2] The method for producing a radiation-sensitive resin composition as described in [1],
  in which a concentration of solid contents of the mixture is 10% by mass or more.

[3] The method for producing a radiation-sensitive resin composition as described in [1] or [2],
  in which the stirrer satisfies a specific Expression (2).

[4] The method for producing a radiation-sensitive resin composition as described in any one of [1] to [3],
  in which the stirrer satisfies a specific Expression (3).

[5] The method for producing a radiation-sensitive resin composition as described in any one of [1] to [4],
  in which the stirring tank includes a baffle plate provided on an inner peripheral surface of the stirring tank.

[6] The method for producing a radiation-sensitive resin composition as described in any one of [1] to [5],
  in which an angle formed by an axial direction and a vertical direction of the stirring shaft is 1° or more and less than 35°.

[7] The method for producing a radiation-sensitive resin composition as described in any one of [1] to [6],
  in which a rotation speed of the stirring shaft is changed in the stirring step.

[8] A pattern forming method comprising:
  forming a resist film on a substrate, by using a radiation-sensitive resin composition produced by the production method as described in any one of [1] to [7];
  exposing the resist film; and
  developing the exposed resist film by using a developer to form a pattern.

According to the present invention, it is possible to provide a method for producing a radiation-sensitive resin composition, by which a radiation-sensitive resin composition having suppressed generation of defects in a pattern thus formed even after a long-term storage is produced.

In addition, according to the present invention, it is possible to provide a pattern forming method.

DESCRIPTION OF THE PREFERRED EMBODIMENTS

Figure 1:
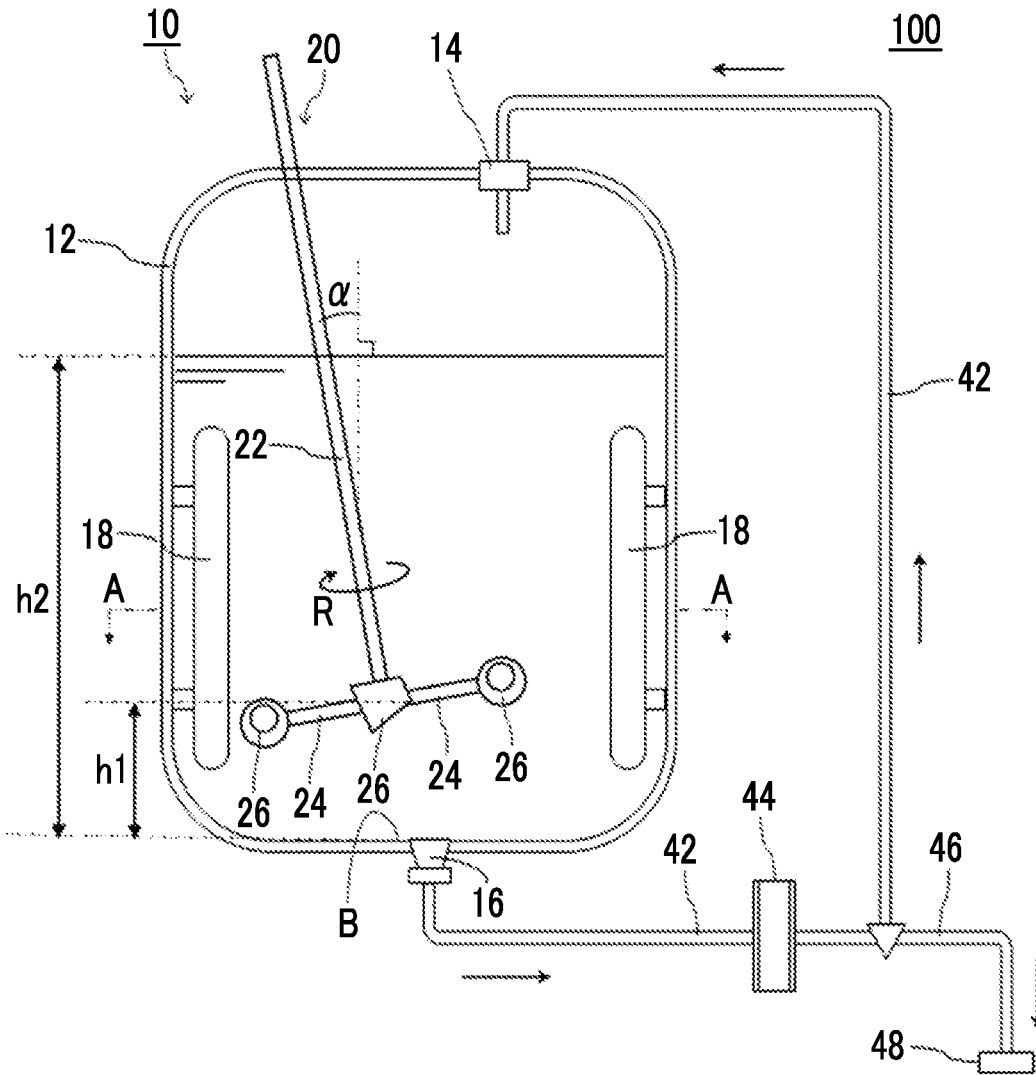
FIG. 1 is a schematic view showing an embodiment of a production device provided with a stirring device used in a method for producing a radiation-sensitive resin composition of an embodiment of the present invention.

Hereinafter, an example of forms for carrying out the present invention will be described.

In the present specification, a numerical value range expressed using "to" means a range that includes the preceding and succeeding numerical values of "to" as a lower limit value and an upper limit value, respectively.

In notations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

The bonding direction of divalent groups cited in the present specification is not limited unless otherwise specified. For example, in a compound represented by General Formula "L-M-N", M may be either *1-OCO—C(CN)=CH-*2 or *1-CH=C(CN)—OCO-*2, assuming that in a case where M is —OCO—C(CN)=CH—, a position bonded to the L side is defined as *1 and a position bonded to the N side is defined as *2.

"(Meth)acryl" in the present specification is a generic term encompassing acryl and methacryl, and means "at least one of acryl or methacryl". Similarly, "(meth)acrylic acid" is a generic term encompassing acrylic acid and methacrylic acid, and means "at least one of acrylic acid or methacrylic acid".

In the present specification, a weight-average molecular weight (Mw), a number-average molecular weight (Mn), and a dispersity (also described as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

"Radiation" in the present specification means, for example, a bright line spectrum of a mercury lamp, far ultraviolet rays typified by an excimer laser, extreme ultraviolet rays (EUV), X-rays, electron beams (EB), or the like. "Light" in the present specification means radiation.

[Method for Producing Radiation-Sensitive Resin Composition]

The method for producing a radiation-sensitive resin composition of an embodiment of the present invention (hereinafter also referred to as a "resist composition" or simply a "composition") is a method for producing a radiation-sensitive resin composition, using a stirring device provided with a stirring tank and a stirrer, the method having the following mixing step and stirring step in this order.

Mixing step: A step of charging a resin, an acid generator, and a solvent into the stirring tank to obtain a mixture including the resin, the acid generator, and the solvent.

Stirring step: A step of stirring the mixture accommodated in the stirring tank, using the stirrer.

Here, a ratio c of a content of the acid generator to a total mass of the mixture is 0.3% by mass or more. In addition, the stirrer is provided with a rotatable stirring shaft, a plurality of support parts attached to the stirring shaft, and a plurality of stirring elements attached to each of end parts of the plurality of support parts, the stirring element has a specific shape and is arranged facing a specific direction, while the position of the stirring element and the ratio c satisfy Expression (1) which will be described later.

As a feature of the production method of the embodiment of the present invention, it can be mentioned that the production method is a method for producing a resist composition including a relatively large amount of an acid generator; and in a case of stirring a mixture of the respective components constituting the resist composition, a position in the vertical direction of a stirring element is adjusted so as to satisfy Expression (1) which will be described later according to a ratio (hereinafter also referred to as a "ratio c") of the content of the acid generator to the total mass of the mixture.

Mechanism by which the generation of defects in a pattern formed using the radiation-sensitive resin composition after a long-term storage is suppressed by adjusting the position of the stirring element in the vertical direction as described above is not clear, but is presumed to be as follows by the present inventors.

The radiation-sensitive resin composition is produced by putting raw materials such as a resin, an acid generator, a solvent, and an acid diffusion control agent into a stirring tank, and stirring the mixture to make each component uniform. Here, it is considered that in a radiation-sensitive resin composition having a high content of an acid generator, the composition being used for forming a resist film for KrF exposure and the like, the highly polar acid generator aggregates to form aggregates which are difficult to dissolve in a solvent, and as a result, these aggregates serve as residues (impurities) which are one of causes of pattern defects. On the other hand, it is presumed that in the method for producing a radiation-sensitive resin composition of the embodiment of the present invention, the stirring efficiency is improved to accelerate a solubility of each component by using a specific stirring element for a mixture for producing a radiation-sensitive resin composition having a large content of an acid generator, while a position of the stirring element to be installed is defined to increase a fluidity of the mixture in a region where a large amount of aggregates of the acid generator are present, and as a result, it is possible to obtain a radiation-sensitive resin composition capable of reducing the number of pattern defects caused by the aggregates of the acid generator.

<Stirring Device and Production Device>

Hereinafter, a stirring device used in the production method of the embodiment of the present invention, and a production device including the stirring device will be described with reference to FIGS. 1 and 2.

FIG. 1 is a schematic view showing an embodiment of a production device including a stirring device used in the method for producing a composition of the embodiment of the present invention.

A stirring device 10 is provided with at least a stirring tank 12 and a stirrer 20. The stirring device 10 accommodates a mixture of components constituting a composition which will be described later in the inside of the stirring tank 12, and stirs the mixture accommodated in the stirring tank 12, using a stirrer 20, to produce a composition.

At least a resin, an acid generator, and a solvent are charged into the stirring tank 12 by a mixing step which will be described later, and as a result, a mixture including at least the resin, the acid generator, and the solvent is accommodated in the stirring tank 12.

In addition, the mixture accommodated in the stirring tank 12 has a ratio c of a content of the acid generator to a total mass of the mixture of 0.3% to 2.5% by mass.

In the production method of the embodiment of the present invention, a radiation-sensitive resin composition having a uniform content of each component and having the effect of the present invention can be obtained by stirring the mixture by the stirring step which will be described later.

Moreover, the mixture accommodated in the stirring tank 12 is not particularly limited, except that it includes a resin, an acid generator, and a solvent and the ratio c is in the range, and the mixture may be the same as a radiation-sensitive resin composition which will be described later, including preferred aspects thereof. That is, the radiation-sensitive resin composition produced by the production method of the embodiment of the present invention includes at least a resin, an acid generator, and a solvent, and has a ratio c of the content of the acid generator to the total mass of the radiation-sensitive resin composition of 0.3% to 2.5% by mass.

It is preferable to determine the content of each component of the mixture such that the concentration of solid contents is 0.5% to 40% by mass. Among those, the concentration of solid contents is preferably 10% by mass or more.

The stirring tank 12 is not particularly limited as long as it is a container having a function of accommodating each component such as a resin, an acid generator, and a solvent included in the radiation-sensitive resin composition, and examples thereof include known stirring tanks.

A shape of the body of the stirring tank 12 is not particularly limited, examples thereof include a cylindrical shape, an elliptical cylinder shape, and a square cylinder shape, and the cylindrical shape or the elliptical cylinder shape is preferable.

A shape of the bottom part of the stirring tank 12 is not particularly limited, examples thereof include a standard flanged dished head shape, an ellipsoidal dished head shape, a flanged only head shape, and a conical head shape, and the standard flanged dished head shape and the ellipsoidal dished head shape are preferable.

The top part of the stirring tank 12 may be provided with a supply port 14 connected to a circulation pipe 42 which will be described later. In addition, the bottom part of the stirring tank 12 may be provided with a discharge port 16 connected to the circulation pipe 42.

The stirring tank 12 may have a material charging port for charging various materials into the stirring tank.

In addition, the stirring tank 12 may have a gas introduction port for introducing a gas into the inside of the stirring tank 12, or may have a gas discharge port for discharging a gas in the inside of the stirring tank 12 to the outside of the stirring tank.

The stirring tank 12 may include a baffle plate 18 provided on an inner peripheral surface of the stirring tank 12. By putting the baffle plate 18 on the inner peripheral surface of the stirring tank, the stirring efficiency can be improved and the effect of the present invention can be further improved. Furthermore, some of the baffle plates 18 are not shown, but in the stirring device 10 shown in FIG. 1, four baffle plates 18 may be symmetrically arranged on the inner peripheral surface of the stirring tank 12.

Moreover, the shape and the number of the baffle plates are not limited to the aspect of the baffle plate 18 shown in FIG. 1. In addition, in the production method of the embodiment of the present invention, a stirring tank having no baffle plate may be used.

As the shape of the baffle plate, a shape extending in the height direction (vertical direction) is preferable, and a flat plate shape or a columnar shape (pipe shape) is preferable.

A length (width) of the baffle plate in the horizontal direction (the direction orthogonal to the vertical direction) is not particularly limited, and is preferably $\frac{1}{16}$ to $\frac{1}{4}$, and more preferably $\frac{1}{16}$ to $\frac{1}{8}$ of an inner diameter of the stirring tank.

A length of the baffle plate in the vertical direction is not particularly limited, but is preferably $\frac{1}{2}$ or more, more preferably $\frac{2}{3}$ or more, and still more preferably $\frac{3}{4}$ or more with respect to a distance from the bottom part of the stirring tank to the liquid level. The upper limit value is not particularly limited, and is preferably 1 or less with respect to the distance from the bottom part of the stirring tank to the liquid level.

The number of the baffle plates is not particularly limited, and is preferably 2 to 8, and more preferably 3 or 4.

In a case where the stirring tank 12 includes a plurality of baffle plates, it is preferable that the plurality of baffle plates are symmetrically arranged on an inner peripheral surface of the stirring tank 12 such that the distances between the adjacent baffle plates are equal.

The stirring device 10 is provided with a stirrer 20 having a function of stirring a liquid accommodated in the stirring tank 12.

The stirrer 20 is provided with a rotatable stirring shaft 22, a plurality of support parts 24 attached to the stirring shaft 22, and a plurality of stirring elements 26 attached to the end parts of the plurality of support parts 24. Here, some of the support parts 24 and the stirring elements 26 are not shown, but in the stirrer 20 shown in FIG. 1, four support parts 24 extend in the radial direction from the lower end part of the stirring shaft 22, and four stirring elements 26 are attached to the end part on the radial direction of each support part 24.

The stirring shaft 22 extends from the outside to the inside of the stirring tank 12, and is rotatably attached to a drive source (for example, a motor or the like) (not shown) on the outside of the stirring tank 12. By rotating stirring shaft 22 in a direction indicated by R by the drive source, the stirring element 26 moves along the circumferential direction of the stirring shaft 22 and each component charged in the stirring tank 12 is stirred.

In the stirring device 10 shown in FIG. 1, the stirring shaft 22 is inclined with respect to the vertical direction. From the viewpoint that the effect of the present invention is more excellent, an angle α formed by the axial direction and the vertical direction of the stirring shaft 22 is preferably 1° or more and less than 35°, and more preferably 15° to 30°. It is presumed that the effect of the present invention is further improved for a reason that a convection formed by the stirring elements 26 is non-uniform by inclining the stirring shaft 22 in the range with respect to the vertical direction.

Furthermore, the stirrer used in the production method of the embodiment of the present invention may be provided with a stirring shaft arranged along the vertical direction (α=0°).

The support part 24 is a member that connects the stirring shaft 22 with the stirring element 26. The support part 24 shown in FIG. 1 is arranged on a plane orthogonal to the radial direction of the stirring shaft 22, that is, the direction in which the stirring shaft 22 extends, from the lower end part of the stirring shaft 22, and extends in a direction away from the stirring shaft 22, and the stirring element 26 is attached to a terminal thereof.

Furthermore, the shape and the constituent materials of the support part are not limited to the aspects shown in FIG. 1 as long as the support part has mechanical characteristics which can support the stirring element in a case of stirring the mixture.

The stirring element 26 has a function of forcibly flowing the liquid stored in the stirring tank 12 by moving in the circumferential direction with the rotation of the stirring shaft 22. As a result, the mixture accommodated in the stirring tank 12 is stirred to make the concentration of each component included in the mixture uniform.

The stirrer 20 shown in FIG. 1 is provided with four stirring elements 26, but the number of the stirring elements 26 is not limited thereto. The number of the stirring elements provided in the stirrer is preferably 2 to 8, and more preferably 3 to 6. In a case where the stirrer is provided with a plurality of stirring elements, it is preferable that the plurality of stirring elements are arranged at equal intervals and symmetrically with respect to the stirring shaft as viewed from the direction in which the stirring shaft extends.

In addition, the plurality of stirring elements may be arranged at positions having different axial directions of the stirring shaft. That is, in a case where the stirring shafts are arranged in the vertical direction, the plurality of stirring elements may be arranged at the same height or may be arranged at different heights.

The stirring element 26 will be described in detail with reference to FIG. 2.

Figure 2:
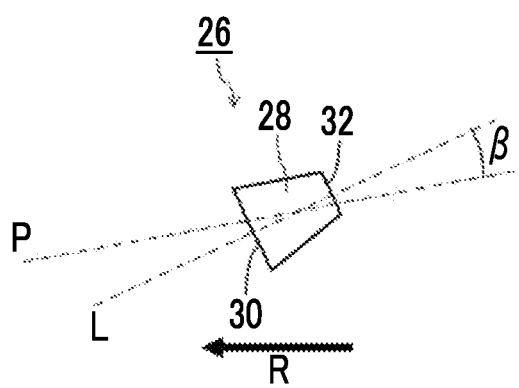
FIG. 2 is a schematic view showing an embodiment of a stirring element used in the method for producing a radiation-sensitive resin composition of the embodiment of the present invention.

FIG. 2 is a schematic view showing an embodiment of the stirring element 26 provided in the stirring device 10. The configuration of the stirring element 26 as seen from the direction in which the support part 24 extends (outside in the radial direction) is shown in FIG. 2.

As shown in FIG. 2, the stirring element 26 consists of a tubular body 28 having a first opening portion 30 and a second opening portion 32 facing each other.

An opening area of the first opening portion 30 is wider than an opening area of the second opening portion 32.

In addition, the stirring element 26 is arranged such that the direction from the second opening portion 32 toward the first opening portion 30 coincides with a rotation direction R of the stirring shaft 22. In other words, the stirrer 20 (stirring shaft 22) rotates in the direction from the second opening portion 32 of the stirring element 26 toward the first opening portion 30.

In addition, the stirring element 26 is arranged such that a central axis L of the tubular body 28 is inclined with respect to a plane P orthogonal to the stirring shaft 22. Here, the central axis L of the tubular body 28 means a straight line passing through the center of the first opening portion 30 and the center of the second opening portion 32.

By setting the stirring element 26 used in the production method of the embodiment of the present invention to have the configuration, it is possible to suppress a torque while reducing a dissolved gas in a case of stirring a mixture which will be described later, as compared with stirring elements such as a paddle blade and a propeller blade.

Furthermore, the shapes of the first opening portion 30 and the second opening portion 32 shown in FIG. 1 are circular, but the shapes of the first opening portion and the second opening portion are not limited to the circular shape. In a case where the shape of each opening portion is not circular, for example, in a case where the shape of each opening portion is elliptical or polygonal, the "center" of each opening portion means a centroid of the shape of each opening portion.

In addition, the stirrer 20 used in the production method of the embodiment of the present invention satisfies Expression (1).

$$h \leq -0.2 \times \ln(c) + 0.25 \tag{1}$$

In Expression (1), h represents a ratio of an average value (average depth) h1 of the depths from the plurality of stirring elements 26 to a bottom part B of the stirring tank 12 with respect to the depth h2 from the liquid level of the mixture accommodated in the stirring tank 12 to the bottom part B of the stirring tank 12.

In addition, in Expression (1), ln(c) represents a natural logarithm of the ratio c (unit:% by mass) of the content of the acid generator to the total mass of the mixture.

By setting the ratio h of the average depth of the plurality of stirring elements 26 provided in the stirrer 20 to satisfy Expression (1), it is possible to produce a radiation-sensitive resin composition capable of suppressing the generation of defects of a pattern formed after a long-term storage even in a case where the content of the acid generator is high.

Furthermore, in the present specification, the "bottom part B of the stirring tank 12" in calculation of the ratio h of the average depth of the plurality of stirring elements 26 means the lowest (deepest) position of the stirring tank 12 in the vertical direction.

In addition, the average depth h1 is a value obtained by averaging the depths from the centroid of the stirring element provided in the stirrer to the bottom part of the stirring tank. In the stirrer 20 shown in FIG. 1, the average depth h1 is a value obtained by averaging the depths from the centroid of the four stirring elements 26 to a bottom part B of the stirring tank 12.

The stirrer 20 preferably satisfies Expression (2) from the viewpoint that the effect of the present invention is more excellent.

$$h \leq -0.1 \times \ln(c) + 0.15 \tag{2}$$

h and ln(c) in Expression (2) have the same definitions as h and ln(c) in Expression (1), respectively.

The lower limit of the ratio h of the average depth of the plurality of stirring elements 26 is not particularly limited, but is preferably more than a ratio of a value obtained by multiplying the diameter of the first opening portion 30 by 3 to the depth h2 from the liquid level of the mixture accommodated in the stirring tank 12 to a bottom part B of the stirring tank 12. In other words, the average value h1 of the depths from the plurality of stirring elements 26 to the bottom part B of the stirring tank 12 is preferably more than a value obtained by multiplying the diameter of the first opening portion 30 by 3.

With regard to the stirrer used for production of the composition, the center of the plurality of stirring elements may be located at the center of the cross-section of the stirring tank in the horizontal direction or may not be located at the center, but from the viewpoint that the effect of the present invention is more excellent, it is preferable that the center of the plurality of stirring elements is not located at the center of the cross-section of the stirring tank in the horizontal direction.

More specifically, it is preferable that the stirrer used for production of the composition satisfies Expression (3).

$$1/16 \leq d1/d2 \leq 3/8 \quad (3)$$

In Expression (3), $d1$ represents a distance between a point C1 located at the center of the plurality of stirring elements and a point C2 located at the center of an inner peripheral surface of the stirring tank in a case where the stirring device is observed from the vertical direction. In addition, in Expression (3), $d2$ represents the inner diameter of the stirring tank in the cross-section of the stirring tank in the horizontal direction.

By setting the stirrer to satisfy Expression (3), the effect of the present invention is further improved. This is presumed to be caused by a fact that a convection formed by the plurality of stirring elements is non-uniform.

Expression (3) will be described in detail with reference to FIG. 3.

Figure 3:
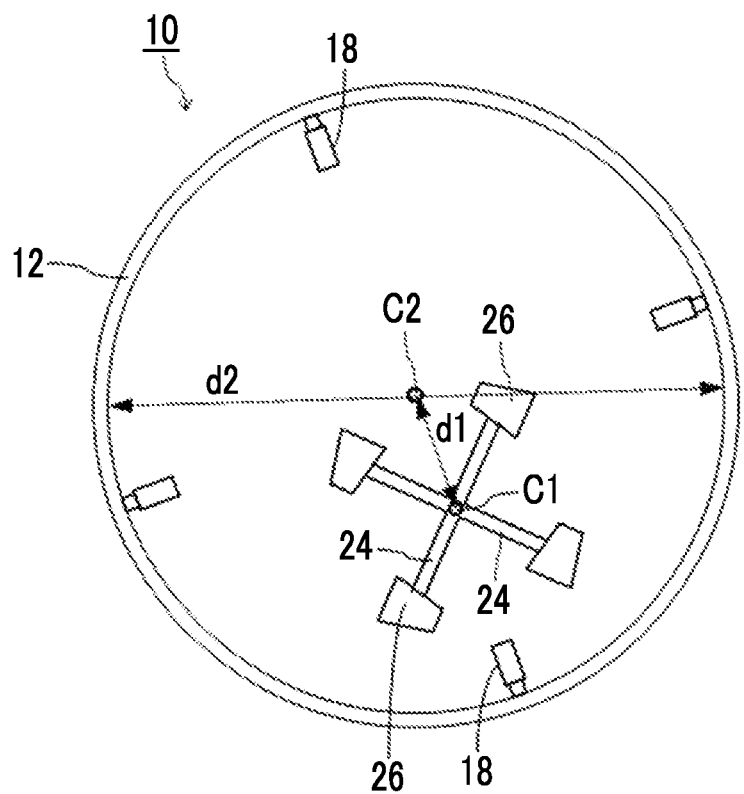
FIG. 3 is a schematic view showing an embodiment of a stirring device whose inside is observed from below in the vertical direction.

FIG. 3 is a schematic view showing an example of the configuration of the stirring device 10 whose inside is observed from below in the vertical direction. Furthermore, in the stirring device 10 shown in FIG. 3, the stirring shaft 22 and the discharge port 16 are omitted for the sake of simplification of the description.

As shown in FIG. 3, a point C1 is located at the center of the plurality of stirring elements 26 in a case where the stirring device 10 is observed from the vertical direction. Here, the "center of a plurality of stirring elements" means a point equidistant from each stirring element. In a case where it is not possible to unambiguously determine points equidistant from all the stirring elements provided in the stirrer, the point C1 means an intersection of a plane including the circular orbit of the stirring element formed by rotation of the stirring shaft and the stirring shaft, and in a case where there are a plurality of such intersections, the point C1 means a point located at a coordinate obtained by averaging the coordinates of those intersections.

The point C2 is located at the center of an inner peripheral surface of the stirring tank in a case where the stirring device is observed from the vertical direction.

In a case where the shape of the body of the stirring tank is other than a cylindrical shape, the "center of an inner peripheral surface of the stirring tank" means a centroid of a shape (for example, an ellipse and a polygon) consisting of crossing lines of an inner peripheral surface of the stirring tank and a cross-section in the horizontal direction including the point C1.

$d1$ in Expression (3) represents a distance between the point C1 and the point C2 (see FIG. 3).

In addition, as shown in FIG. 3, $d2$ in Expression (3) represents an inner diameter of the stirring tank 12 in a cross-section of the stirring tank 12 in the horizontal direction (a cross-section of the stirring tank 12 observed from the vertical direction). Furthermore, the "inner diameter of the stirring tank in the cross-section of the stirring tank" represented by $d2$ in the horizontal direction means twice the shortest distance from the point C2 to the inner peripheral surface of the stirring tank in a case where the shape of the body of the stirring tank is other than the cylindrical shape. For example, in a case where the shape of the cross-section in the horizontal direction of the body of the stirring tank is an ellipse, twice the minor axis of the ellipse corresponds to the inner diameter of the stirring tank.

In the stirring element 26, the direction of inclination of the central axis L of the tubular body 28 is not particularly limited. That is, the central axis L may be inclined such that the first opening portion 30 side of the central axis L is positioned downward or upward with respect to a plane P orthogonal to the stirring shaft 22 (see FIG. 2). In addition, an angle $\beta$ formed by the central axis L of the tubular body 28 and the plane P orthogonal to the stirring shaft 22 is not particularly limited, but an absolute value of the angle $\beta$ is preferably 5° to 25°, and more preferably 10° to 20°.

The opening areas of the first opening portion 30 and the second opening portion 32 are not particularly limited, and may be set according to the physical properties such as a viscosity of the mixture. In the stirring element 26, the ratio of the opening area of the first opening portion 30 to the opening area of the second opening portion 32 is preferably 1.4 to 3.

It is preferable that a liquid contact portion (a part in contact with the liquid) of the stirring device and a production device which will be described later is lined or coated with a fluorine resin and the like.

Returning to FIG. 1, the production device 100 is provided with the stirring device 10, the circulation pipe 42, the filter 44 arranged in the circulation pipe 42, the discharge pipe 46 connected to the circulation pipe 42 on the downstream side of the filter 44, and the discharge nozzle 48 provided at an end part on the downstream side of the discharge pipe 46.

One end of the circulation pipe 42 is connected to the bottom part of the stirring tank 12 via the discharge port 16, and the other end is connected to the top part of the stirring tank 12 via the supply port 14. By using the circulation pipe 42, the composition discharged from the stirring tank 12 can be returned to the stirring tank 12. The function of the circulation pipe 42 will be described in detail in a circulation-filtering step which will be described later.

The filter 44 is not particularly limited, and a known filter can be used.

A pore diameter (pore size) of the filter is preferably 0.20 μm or less, more preferably 0.10 μm or less, and still more preferably 0.05 μm or less. The lower limit value is not particularly limited, but may be 0.001 μm or more.

Examples of a material of the filter include fluororesins such as polytetrafluoroethylene, perfluoroalkoxyalkane, a perfluoroethylenepropene copolymer, polyvinylidenefluoride, and an ethylenetetrafluoroethylene copolymer, polyolefin resins such as polypropylene and polyethylene, polyamide resins such as nylon 6 and nylon 66, and polyimide resins. Examples of the filter made of the polyimide resin (polyimide filter) include the polyimide filters described in JP2017-064711A and JP2017-064712A.

As the filter, a filter which has been washed with an organic solvent in advance may be used.

As the filter, a filter having a reduced amount of elutes as disclosed in JP2016-201426A is preferable.

The composition produced in the stirring tank 12 is fed to the discharge pipe 46 via the circulation pipe 42, and is accommodated in a predetermined container (not shown) connected to the discharge nozzle 48 via the discharge nozzle 48.

In the production device 100, a buffer tank that stores the filtered composition may be arranged on the downstream side of the filter 44.

The production of the composition using the stirring device is preferably carried out in a clean room.

That is, it is preferable that the stirring device and the production device used for the production of the composition are installed in a clean room. The degree of cleanliness is preferably Class 6 or less, more preferably Class 5 or less, and still more preferably Class 4 or less in International Standard ISO 14644-1.

Hereinafter, each step of the method for producing the composition of the embodiment of the present invention will be described.

Furthermore, the configurations of the stirring device and the production device used in the method for producing the composition of the embodiment of the present invention are not limited to the aspects shown in FIGS. 1 and 2.

<Mixing Step>

The production method of the embodiment of the present invention includes a mixing step of charging a resin, an acid generator, and a solvent into a stirring tank to obtain a mixture including the resin, the acid generator, and the solvent.

In the mixing step, the procedure for charging the components into the stirring tank is not particularly limited.

Examples thereof include a method of charging a resin, an acid generator, a solvent, and other components from a material charging port of a stirring tank. In a case of charging the respective components, the components may be charged sequentially or collectively. In addition, in a case of charging one component, the component may be charged a plurality of times.

In addition, in a case where the respective components are sequentially charged into the stirring tank, the order of charging is not particularly limited, but it is preferable that the solvent is first charged and then the remaining components are charged sequentially or collectively.

In addition, in a case where the components other than the solvent are charged into the stirring tank, the components may be charged into the stirring tank as a solution in which the components are dissolved in the solvent or as a dispersion liquid in which the components are dispersed in the solvent. At that time, a solution obtained by filter filtration may be used in order to remove the insoluble matter in the solution.

A concentration of the component in the solution or the dispersion liquid is not particularly limited, but is preferably 10% to 50% by mass with respect to a total mass of the solution.

In addition, in a case where the solvent is charged into the stirring tank, the solvent may be filtered with a filter and then charged into the stirring tank. Examples of the filter used above include the filter used as the filter 44.

In a case where various components are charged into the stirring tank, a liquid feeding pump may be used.

<Stirring Step>

The production method of the embodiment of the present invention has a stirring step of stirring the mixture accommodated in the stirring tank, using a stirrer.

The stirring method is not particularly limited as long as the stirring step is a treatment of stirring the mixture using the stirring tank and the stirrer described above, but it is preferable to set the stirring conditions such that the mixture is sufficiently stirred to make the concentration of each component uniform.

A temperature of the mixture stirred by the stirring step is not particularly limited, but is preferably 15° C. to 32° C., and more preferably 20° C. to 24° C.

In addition, in the stirring step, the temperature of the mixture is preferably kept constant, and is preferably within ±10° C., more preferably within ±5° C., and still more preferably within ±1° C. from a set temperature.

A treatment time in the stirring step is not particularly limited, but is preferably 1 to 48 hours, and more preferably 15 to 24 hours from the viewpoint of a balance of the uniformity of the obtained composition and the productivity.

A rotation speed of the stirring shaft in the stirring step is not particularly limited, but is preferably 20 to 500 revolutions per minute (rpm), more preferably 40 to 350 rpm, and still more preferably 50 to 300 rpm.

In addition, it is preferable to change the rotation speed of the stirring shaft in the stirring step from the viewpoint that the effect of the present invention is more excellent. Examples of the method for changing the rotation speed of the stirring shaft include a method of repeating a period of rotating the stirring shaft and a period of stopping the rotation of the stirring shaft, and a method of repeating a plurality of periods having different rotation speeds, and from the viewpoint that the effect of the present invention is more excellent, a method of repeating two or more periods having different rotation speeds is preferable.

Examples of the method of repeating two or more periods having different rotation speeds include a method in which a plurality of periods including at least a period A having a relatively high rotation speed and a period B having a relatively slow rotation speed are repeated.

The rotation speed of the stirring shaft in the period A is not particularly limited, but is preferably 100 to 500 rpm, and more preferably 150 to 300 rpm. The rotation speed of the stirring shaft in the period B is not particularly limited, but is preferably 20 to 200 rpm, and more preferably 50 rpm or more and less than 150 rpm. In addition, the length of each of the periods is not particularly limited, but it is preferable to change the rotation speed in about 5 minutes to 5 hours (more preferably 10 minutes to 1 hour).

In addition, the rotation speed of the stirring shaft may be continuously changed within the preferred range.

In a case of stopping the stirring step, it is preferable to confirm that the respective components are dissolved in the solvent. A method for confirming that the respective components are dissolved in the solvent is not particularly limited, and examples thereof include a method in which the dissolution is confirmed by sensitivity evaluation. More specifically, examples of the method include a method in which a mixture is sampled at different stirring times (for example, at each elapsed time, such as 10 hours, 11 hours, 12 hours, and the like from the start of stirring), and it is determined that the mixture is uniformly dissolved in a case where a sensitivity (an exposure amount required to obtain a specified pattern size) is constant.

In the stirring step, an ultrasonic wave may be applied to the mixture.

As described above, the composition produced in the stirring tank 12 is filled in a predetermined container via a part of the circulation pipe 42, the discharge pipe 46, and the discharge nozzle 48.

In a case where a capacity of the container is, for example, 0.75 L or more and less than 5 L, the filling rate is preferably 0.3 to 3 L/min, more preferably 0.4 to 2.0 L/min, and still more preferably 0.5 to 1.5 L/min at the time of filling the radiation-sensitive resin composition into the container.

A plurality of containers may be filled at the same time by using a plurality of discharge nozzles arranged in parallel in order to improve the filling efficiency.

Examples of the container include a bloom-treated glass container and a container in which the liquid contact portion is treated to be a fluorine resin.

In a case where the composition is accommodated in the container, a space in the container (a region in the container not occupied by the composition) may be substituted with a predetermined gas. The gas is preferably a gas which is inert or non-reactive with respect to the composition, and specific examples thereof include nitrogen and noble gases such as helium and argon.

Furthermore, before the composition is accommodated in the container, a degassing treatment for removing the dissolved gas in the composition may be carried out. Examples of the degassing method include an ultrasonic treatment and a defoaming treatment.

<Other Steps>

The production method of the embodiment of the present invention may have steps other than the mixing step and the stirring step.

Examples of such other steps include a filtration treatment and a cleaning step.

(Filtration Treatment)

In the method for producing the composition, the composition obtained by the stirring step may be subjected to a filtration treatment. By carrying out the filtration treatment, a content of impurities included in the composition obtained as a final product can be reduced.

Hereinafter, the filtration treatment will be described with reference to the production device 100 shown in FIG. 1.

Examples of the filtration treatment of the composition using the production device 100 include a method in which the composition accommodated in the stirring tank 12 is fed to the circulation pipe 42 and the composition is filtered with the filter 44. The feeding of the composition from the stirring tank 12 to the circulation pipe 42 can be performed, for example, by opening a valve (not shown).

A method for feeding the composition from the stirring tank 12 to the circulation pipe 42 is not particularly limited, and examples thereof include a method of feeding a liquid using gravity, a method of applying a pressure from a liquid level side of the composition, a method of setting a pressure on the circulation pipe 42 side to a negative pressure, and a method obtained by combination of two or more of these methods.

In a case of the method of applying a pressure from the liquid level side of the composition, examples of the method include a method of utilizing a flow pressure generated by feeding a liquid and a method of pressurizing a gas.

The flow pressure is preferably generated by, for example, a pump (a liquid feeding pump, a circulation pump, and the like), or the like. Examples of the pump include uses of a rotary pump, a diaphragm pump, a metering pump, a chemical pump, a plunger pump, a bellows pump, a gear pump, a vacuum pump, an air pump, and a liquid pump, as well as commercially available pumps as appropriate. A position where the pump is arranged is not particularly limited.

The gas used for pressurization is preferably a gas which is inert or non-reactive with respect to the composition, and specific examples thereof include nitrogen and noble gases such as helium and argon. Incidentally, it is preferable that the circulation pipe 42 side is not decompressed but has an atmospheric pressure.

As a method of making the circulation pipe 42 side have a negative pressure, decompression by a pump is preferable, and decompression to vacuum is more preferable.

Specific examples of the filter 44 are as described above.

A differential pressure (a pressure difference between the upstream side and the downstream side) applied to the filter 44 is preferably 200 kPa or less, and more preferably 100 kPa or less.

In addition, in a case of performing the filtration with the filter 44, it is preferable that a change in the differential pressure during the filtration is small. The differential pressure before and after the filtration for a period from a point in time that the passage of the liquid through a filter is started to a point in time that 90% by mass of the solution to be filtered is finished is maintained to be preferably within ±50 kPa, and more preferably within ±20 kPa of the differential pressure before and after the filtration at the point in time that the passage of the liquid is started.

In a case of performing the filtration with the filter 44, a linear velocity is preferably in the range of 3 to 150 L/(hr·m$^2$), more preferably 5 to 120 L/(hr·m$^2$), and still more preferably 10 to 100 L/(hr·m$^2$).

(Circulation-Filtering Step)

In the production device 100, the composition which has passed through the filter 44 may be fed to the circulation pipe 42, returned to the stirring tank 12 via the supply port 14, and subjected to a circulation-filtering step of filtering the composition again with the filter 44.

In a case where the composition is subjected to circulation-filtration, the composition may be discharged to a predetermined container through the discharge pipe 46 and the discharge nozzle 48 at the same time; or the valve (not shown) provided in the discharge pipe 46 may be closed and discharged to stop the liquid feeding to the discharge nozzle 48, and the entire amount of the composition which has passed through the filter 44 may be returned to the stirring tank 12 via the circulation pipe 42.

It is preferable to carry out the circulation-filtration from the viewpoint that the impurities included in the composition are further reduced. The number of times of circulation-filtration is not particularly limited, but it is preferable that the composition accommodated in the stirring tank 12 is returned to the stirring tank 12 once or more (the composition goes around the circulation pipe 42 once or more), it is more preferable that the composition is returned 10 times or more, and it is still more preferable that the composition is returned 20 times or more. The upper limit value is not particularly limited, but is preferably 100 times or less.

The number of times of the circulation-filtration is calculated from the amount of the composition accommodated in the stirring tank 12 and the flow amount of the composition passing through the filter 44. That is, a case where a ratio of the integrated value of the flow amount of the composition passing through the filter 44 to the stored amount of the composition accommodated in the stirring tank 12 (integrated flow amount of the composition/stored amount of the composition) is 2 times or more by volume means that the composition is returned to the stirring tank 12 once or more. Similarly, a case where the ratio is 3 times or more by volume means that the composition is returned to the stirring tank 12 twice or more, and a case where the ratio is 4 times or more by volume means that the composition is returned 3 times or more.

(Cleaning Step)

In the method for producing a composition, a cleaning step of cleaning the production device with a solvent may be carried out before the mixing step. By carrying out the cleaning step, a residue derived from the radiation-sensitive resin composition (for example, a residue derived from the resin and a residue derived from the photoacid generator) adhering to the production device can be removed.

In the cleaning step, it is preferable to clean at least a liquid contact portion (in particular, a liquid contact portion of the stirring tank) of the production device with which the composition comes into contact with the production method with a solvent (hereinafter also described to as a "solvent A").

The solvent A is not particularly limited, but examples thereof include an amide-based solvent, an alcohol-based solvent, an ester-based solvent, a glycol ether-based solvent (including a glycol ether-based solvent having a substituent), a ketone-based solvent, an alicyclic ether-based solvent, an aliphatic hydrocarbon-based solvent, an aromatic ether-based solvent, and an aromatic hydrocarbon-based solvent.

In the cleaning step, the cleaning may be performed a plurality of times. The number of cleaning is preferably 3 times or more, and more preferably 10 times or more.

In addition, in the cleaning step, cleaning may be performed while circulating the solvent A in the production device. That is, so-called circulation-cleaning may be performed. In a case where the circulation-cleaning is carried out, the filter may be arranged in the conduit through which the solvent A passes. By arranging the filter, insoluble matter and the like generated by cleaning can be removed.

Furthermore, the filter used in the circulation-cleaning is not particularly limited, and examples thereof include the filter described as the filter 44, including preferred aspects.

A liquid temperature of the solvent A in the cleaning step is preferably 20° C. or higher. The upper limit of the liquid temperature of the solvent A is appropriately selected from the viewpoints of safety such as the flash point of the solvent A and the heat resistance of the equipment.

The method for controlling the liquid temperature is not particularly limited, and examples thereof include a method of charging a solvent which has been preheated into the equipment and a method of using a temperature control device installed in the mixing equipment.

The solvent A used in the cleaning step is preferably filtered with a filter before use. The filter used is not particularly limited, and examples thereof include the filter described as the filter 44, including preferred aspects.

In a case where the solvent A is filtered with a filter, a plurality of filters connected in series or in parallel may be used. In a case where the plurality of filters are used, a combination of filters having different pore diameters and/or materials may be used. In addition, in the filtration with a filter, circulation-filtration may be carried out. As a method of circulation-filtration, for example, the method disclosed in JP2002-062667A is preferable.

Moreover, after the filter filtration, impurities may be further removed by an adsorbing material.

In addition, in the cleaning step for the production device, water may be used for cleaning. Examples of the cleaning method with water include a cleaning method using nanobubbles or microbubbles.

[Pattern Forming Method]

The radiation-sensitive resin composition produced by the above-mentioned production method is used for pattern formation.

More specifically, the procedure of the pattern forming method using the composition of the embodiment of the present invention is not particularly limited, but preferably has the following steps.

Step A: A step of forming a resist film on a substrate using the composition of the embodiment of the present invention Step B: A step of exposing the resist film Step C: A step of developing the exposed resist film using a developer to form a pattern Hereinafter, the procedure of each of the steps will be described in detail.

<Step A: Resist Film Forming Step>

The step A is a step of forming a resist film on a substrate using the composition of the embodiment of the present invention.

The composition of the embodiment of the present invention is as described above.

Examples of the method of forming a resist film on a substrate using the composition include a method of applying the composition onto a substrate.

In addition, it is preferable that the composition before the application is filtered through a filter, as necessary. A pore size of the filter is preferably 0.1 μm or less, more preferably 0.05 μm or less, and still more preferably 0.03 μm or less. In addition, the filter is preferably a polytetrafluoroethylene-, polyethylene-, or nylon-made filter.

The composition can be applied onto a substrate (for example, silicon and silicon dioxide coating) as used in the manufacture of integrated circuit elements by a suitable application method such as ones using a spinner or a coater. As the application method, spin application using a spinner is preferable.

After applying the composition, the substrate may be dried to form a resist film. In addition, various underlying films (an inorganic film, an organic film, or an antireflection film) may be formed on the underlayer of the resist film.

Examples of the drying method include a heating method (pre-baking: PB). The heating may be performed using a unit included in an ordinary exposure machine and/or an ordinary development machine, and may also be performed using a hot plate or the like.

The heating temperature is preferably 80° C. to 150° C., and more preferably 80° C. to 140° C.

The heating time is preferably 30 to 1,000 seconds, and more preferably 40 to 800 seconds.

A film thickness of the resist film is not particularly limited, but in a case of a resist film for KrF exposure, the film thickness is preferably 0.2 to 20 μm, more preferably 0.5 to 15 μm, and more preferably 1 to 12 μm.

In addition, in a case of a resist film for ArF exposure or EUV exposure, the film thickness is preferably 30 to 700 nm, and more preferably 40 to 400 nm.

Moreover, a topcoat may be formed on the upper layer of the resist film, using the topcoat composition.

It is preferable that the topcoat composition is not mixed with the resist film and can be uniformly applied onto the upper layer of the resist film.

The film thickness of the topcoat is preferably 10 to 200 nm, and more preferably 20 to 100 nm.

The topcoat is not particularly limited, a topcoat known in the related art can be formed by a method known in the related art, and for example, the topcoat can be formed in accordance with the description in paragraphs 0072 to 0082 of JP2014-059543A.

<Step B: Exposing Step>

The step B is a step of exposing the resist film.

Examples of the exposing method include a method of irradiating a resist film thus formed with radiation through a predetermined mask.

Examples of the radiation include infrared light, visible light, ultraviolet light, far ultraviolet light, extreme ultraviolet light, X-rays, and electron beams (EB), preferably a far ultraviolet light having a wavelength of 250 nm or less, more preferably a far ultraviolet light having a wavelength of 220 nm or less, and still more preferably a far ultraviolet light having a wavelength of 1 to 200 nm, specifically, KrF excimer laser (248 nm), ArF excimer laser (193 nm), $F_2$ excimer laser (157 nm), EUV (13 nm), X-rays, and EB.

It is preferable to bake (post-exposure bake: PEB) after exposure and before developing.

The heating temperature is preferably 80° C. to 150° C., and more preferably 80° C. to 140° C.

The heating time is preferably 10 to 1,000 seconds, and more preferably 10 to 180 seconds.

The heating may be performed using a unit included in an ordinary exposure machine and/or an ordinary development machine, and may also be performed using a hot plate or the like.

This step is also described as a post-exposure baking.

<Step C: Developing Step>

The step C is a step of developing the exposed resist film using a developer to form a pattern.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a paddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

Furthermore, after the step of performing development, a step of stopping the development may be carried out while substituting the solvent with another solvent.

A developing time is not particularly limited as long as it is a period of time where the unexposed area of a resin is sufficiently dissolved, and is preferably 10 to 300 seconds, and more preferably 20 to 120 seconds.

The temperature of the developer is preferably 0° C. to 50° C., and more preferably 15° C. to 35° C.

Examples of the developer include an alkali developer and an organic solvent developer.

As the alkali developer, it is preferable to use an aqueous alkaline solution including an alkali. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 15.0.

The organic solvent developer is a developer including an organic solvent.

Examples of the organic solvent used in the organic solvent developer include known organic solvents, and include an ester-based solvent, a ketone-based solvent, an alcohol-based solvent, an amide-based solvent, an ether-based solvent, and a hydrocarbon-based solvent.

<Other Steps>

It is preferable that the pattern forming method includes a step of performing cleaning using a rinsing liquid after the step C.

Examples of the rinsing liquid used in the rinsing step after the step of performing development using the developer include pure water. Furthermore, an appropriate amount of a surfactant may be added to pure water.

An appropriate amount of a surfactant may be added to the rinsing liquid.

In addition, an etching treatment on the substrate may be carried out using a pattern formed as a mask. That is, the substrate (or the underlayer film and the substrate) may be processed using the pattern thus formed in the step C as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step C as a mask is preferable.

The dry etching may be one-stage etching or multi-stage etching. In a case where the etching is etching including a plurality of stages, the etchings at the respective stages may be the same treatment or different treatments.

For etching, any of known methods can be used, and various conditions and the like are appropriately determined according to the type of a substrate, usage, and the like. Etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with "Chapter 4 Etching" in "Semiconductor Process Text Book, 4th Ed., published in 2007, publisher: SEMI Japan".

Among those, oxygen plasma etching is preferable as the dry etching.

It is preferable that various materials (for example, a solvent, a developer, a rinsing liquid, a composition for forming an antireflection film, and a composition for forming a topcoat) used in the production method and the composition of the embodiments of the present invention do not include impurities such as metals. A content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mn, Mg, Al, Li, Cr, Ni, Sn, Ag, As, Au, Ba, Cd, Co, Mo, Zr, Pb, Ti, V, W, and Zn.

Examples of a method for removing impurities such as metals from the various materials include filtration using a filter. A pore diameter of the filter is preferably 0.20 or less, more preferably 0.05 µm or less, and still more preferably 0.01 µm or less.

As a material of the filter, a fluorine resin such as polytetrafluoroethylene (PTFE) and perfluoroalkoxyalkane (PFA), a polyolefin resin such as polypropylene and polyethylene, and a polyamide resin such as nylon 6 and nylon 66 are preferable. As the filter, a filter which has been washed with an organic solvent in advance may be used. In the step of filtration using a filter, a plurality of filters or a plurality of kinds of filters connected in series or in parallel may be used. In a case of using the plurality of kinds of filters, a combination of filters having different pore diameters and/or materials may be used. In addition, various materials may be filtered plural times, and the step of filtering plural times may be a circulation-filtration step. As the circulation-filtration step, for example, the method disclosed in JP2002-062667A is preferable.

As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, or organic adsorbing materials such as activated carbon can be used. Examples of the metal adsorbent include those disclosed in JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation and the like are performed under conditions suppressing contamination as much as possible by performing a lining or coating with a fluorine resin and the like in the inside of a device. Preferred conditions for the filtration using a filter performed on the raw materials constituting various materials are the same ones as the above-mentioned conditions.

In order to prevent impurities from being incorporated, it is preferable that various materials are stored in the container described in US2015/0227049A, JP2015-123351A, JP2017-013804A, or the like.

Various materials may be used after being diluted with the solvent used in the composition.

[Radiation-Sensitive Resin Composition]

The radiation-sensitive resin composition of the embodiment of the present invention includes at least a resin, an acid generator, and a solvent.

Hereinafter, the components included in the radiation-sensitive resin composition will be described in detail.

<Resin>

The radiation-sensitive resin composition includes a resin.

As the resin, a resin having a polarity that increases by the action of an acid (hereinafter also simply referred to as a "resin (A)") is preferred.

Furthermore, it is preferable that the resin does not have a repeating unit having a silicon atom but has a repeating unit derived from a monomer having a (meth)acryl group.

The resin (A) preferably has a repeating unit (A-a) having an acid-decomposable group (hereinafter also simply referred to as a "repeating unit (A-a)").

The acid-decomposable group refers to a group that decomposes by the action of an acid to produce a polar group. The acid-decomposable group preferably has a structure in which the polar group is protected by a leaving group that leaves by the action of an acid. That is, the resin (A) has a repeating unit (A-a) having a group that decomposes by the action of an acid to produce a polar group. A resin having this repeating unit (A-a) has an increased polarity by the action of an acid, and thus has an increased solubility in an alkali developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Among those, as the polar group, the carboxyl group, the phenolic hydroxyl group, the fluorinated alcohol group (preferably a hexafluoroisopropanol group), or the sulfonic acid group is preferable.

Examples of the leaving group that leaves by the action of an acid include groups represented by Formulae (Y1) to (Y4).

$$—C(Rx_1)(Rx_2)(Rx_3) \quad \text{Formula (Y1):}$$

$$—C(=O)OC(Rx_1)(Rx_2)(Rx_3) \quad \text{Formula (Y2):}$$

$$—C(R_{36})(R_{37})(OR_{38}) \quad \text{Formula (Y3):}$$

$$—C(Rn)(H)(Ar) \quad \text{Formula (Y4):}$$

In Formula (Y1) and Formula (Y2), $Rx_1$ to $Rx_3$ each independently represent an (linear or branched) alkyl group or a (monocyclic or polycyclic) cycloalkyl group. Furthermore, in a case where all of $Rx_1$ to $Rx_3$ are each an (linear or branched) alkyl group, it is preferable that at least two of $Rx_1$, $Rx_2$, or $R_3$ are methyl groups.

Above all, it is preferable that $Rx_1$ to $Rx_3$ each independently represent a linear or branched alkyl group, and it is more preferable that $Rx_1$ to $Rx_3$ each independently represent the linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent substituent. $R_{37}$ and $R_{38}$ may be bonded to each other to form a ring. Examples of the monovalent substituent include an alkyl group, a cycloalkyl group, an aryl group, an aralkyl group, and an alkenyl group. It is also preferable that $R_{36}$ is the hydrogen atom.

As Formula (Y3), a group represented by Formula (Y3-1) is preferable.

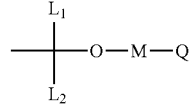

(Y3-1)

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may have a heteroatom, a cycloalkyl group which may have a heteroatom, an aryl group which may have a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane ring group. In these aspects, since the glass transition temperature (Tg) and the activation energy are increased, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

As the repeating unit (A-a), a repeating unit represented by Formula (A) is also preferable.

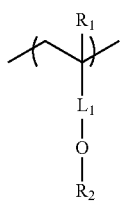
(A)

$L_1$ represents a divalent linking group which may have a fluorine atom or an iodine atom, $R_1$ represents a hydrogen atom, a fluorine atom, an iodine atom, a fluorine atom, an alkyl group which may have an iodine atom, or an aryl group which may have a fluorine atom or an iodine atom, and $R_2$ represents a leaving group that leaves by the action of an acid and may have a fluorine atom or an iodine atom. It should be noted that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —SO$_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, $L_1$ is preferably —CO—, or -arylene group-alkylene group having fluorine atom or iodine atom from the viewpoint that the effect of the present invention is more excellent.

As the arylene group, a phenylene group is preferable.

The alkylene group may be linear or branched. The number of carbon atoms of the alkylene group is not particularly limited, but is preferably 1 to 10, and more preferably 1 to 3.

The total number of fluorine atoms and iodine atoms included in the alkylene group having a fluorine atom or an iodine atom is not particularly limited, but is preferably 2 or more, more preferably 2 to 10, and still more preferably 3 to 6 from the viewpoint that the effect of the present invention is more excellent.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3 from the viewpoint that the effect of the present invention is more excellent.

The alkyl group may have a heteroatom such as an oxygen atom, other than a halogen atom.

$R_2$ represents a leaving group that leaves by the action of an acid and may have a fluorine atom or an iodine atom.

Among those, examples of the leaving group include groups represented by Formulae (Z1) to (Z4).

| —C(Rx$_{11}$)(Rx$_{12}$)(Rx$_{13}$). | Formula (Z1): |
|---|---|
| —C(=O)OC(Rx$_{11}$)(Rx$_{12}$)(Rx$_{13}$). | Formula (Z2): |
| —C(R$_{136}$)(R$_{137}$)(OR$_{138}$). | Formula (Z3): |
| —C(Rn$_1$)(H)(Ar$_1$) | Formula (Z4): |

In Formulae (Z1) and (Z2), Rx$_{11}$ to Rx$_{13}$ each independently represent an (linear or branched) alkyl group which may have a fluorine atom or an iodine atom, or a (monocyclic or polycyclic) cycloalkyl group which may have a fluorine atom or an iodine atom. Furthermore, in a case where all of Rx$_{11}$ to Rx$_{13}$ are each an (linear or branched) alkyl group, it is preferable that at least two of Rx$_{11}$, Rx$_{12}$, or Rx$_{13}$ are methyl groups.

Rx$_{11}$ to Rx$_{13}$ are the same as Rx$_1$ to Rx$_3$ in Formulae (Y1) and (Y2) mentioned above, respectively, except that they may have a fluorine atom or an iodine atom, and have the same definitions and suitable ranges as those of the alkyl group and the cycloalkyl group.

In Formula (Z3), R$_{136}$ to R$_{138}$ each independently represent a hydrogen atom, or a monovalent substituent which may have a fluorine atom or an iodine atom. R$_{137}$ and R$_{138}$ may be bonded to each other to form a ring. Examples of the monovalent substituent which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group formed by combination thereof (for example, a group formed by combination of the alkyl group and the cycloalkyl group).

Incidentally, the alkyl group, the cycloalkyl group, the aryl group, and the aralkyl group may include a heteroatom such as an oxygen atom, in addition to the fluorine atom and the iodine atom. That is, in the alkyl group, the cycloalkyl group, the aryl group, and the aralkyl group, for example, one of the methylene groups may be substituted with a heteroatom such as an oxygen atom or a group having a heteroatom, such as a carbonyl group.

As Formula (Z3), a group represented by Formula (Z3-1) is preferable.

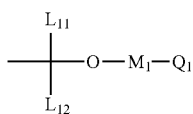

(Z3-1)

Here, $L_{11}$ and $L_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group formed by combination thereof (for example, a group formed by combination of an alkyl group and a cycloalkyl group, each of which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; a group formed by combination thereof (for example, a group formed by combination of the alkyl group and the cycloalkyl group, each of which may have a heteroatom selected from the group consisting of a fluorine atom, an iodine atom, and an oxygen atom).

In Formula (Z4), $Ar_1$ represents an aromatic ring group which may have a fluorine atom or an iodine atom. $Rn_1$ is an alkyl group which may have a fluorine atom or an iodine atom, a cycloalkyl group which may have a fluorine atom or an iodine atom, or an aryl group which may have a fluorine atom or an iodine atom. $Rn_1$ and $Ar_1$ may be bonded to each other to form a non-aromatic ring.

As the repeating unit (A-a), a repeating unit represented by General Formula (AI) is also preferable.

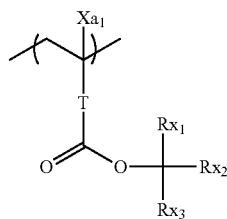

(AI)

In General Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by $-CH_2-R_{11}$. Ru represents a halogen atom (a fluorine atom or the like), a hydroxyl group, or a monovalent substituent, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a —COO-Rt- group, and an —O-Rt- group. In the formulae, Rt represents an alkylene group or a cycloalkylene group.

T is preferably the single bond or the —COO-Rt- group. In a case where T represents the —COO-Rt-group, Rt is preferably an alkylene group having 1 to 5 carbon atoms, and more preferably a —CH$_2$— group, a —(CH$_2$)$_2$— group, or a —(CH$_2$)$_3$— group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

The resin (A) may have one kind of the repeating unit (A-a) alone or may have two or more kinds thereof.

A content of the repeating unit (A-a) (a total content in a case where two or more kinds of the repeating units (A-a) are present) is preferably 15% to 80% by mole, and more preferably 20% to 70% by mole with respect to all repeating units in the resin (A).

The resin (A) preferably has at least one repeating unit selected from the group consisting of repeating units represented by General Formulae (A-VIII) to (A-XII) as the repeating unit (A-a).

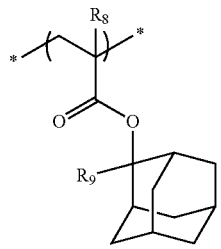
(A-VIII)

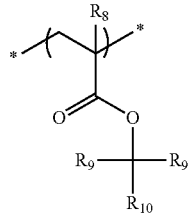
(A-IX)

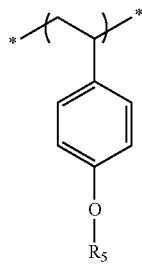
(A-X)

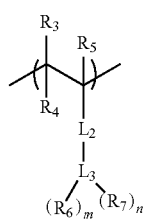
(A-XI)

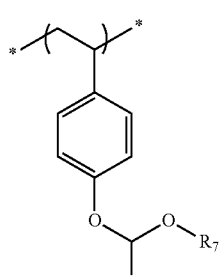
(A-XII)

In General Formula (A-VIII), $R_5$ represents a tert-butyl group or a —CO—O-(tert-butyl) group.

In General Formula (A-IX), $R_6$ and $R_7$ each independently represent a monovalent substituent. Examples of the monovalent substituent include an alkyl group, a cycloalkyl group, an aryl group, an aralkyl group, and an alkenyl group.

In General Formula (A-X), p represents 1 or 2.

In General Formulae (A-X) to (A-XII), $R_8$ represents a hydrogen atom or an alkyl group having 1 to 3 carbon atoms, and $R_9$ represents an alkyl group having 1 to 3 carbon atoms.

In General Formula (A-XII), $R_{10}$ represents an alkyl group having 1 to 3 carbon atoms or an adamantyl group.

(Repeating Unit Having Acid Group)

The resin (A) may have a repeating unit having an acid group.

As the repeating unit having an acid group, a repeating unit represented by General Formula (B) is preferable.

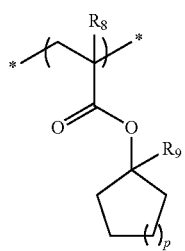
(B)

$R_3$ represents a hydrogen atom or a monovalent substituent which may have a fluorine atom or an iodine atom. The monovalent substituent which may have a fluorine atom or an iodine atom is preferably a group represented by $-L_4-R_8$. $L_4$ represents a single bond or an ester group. $R_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be either a monocycle or a polycycle, and examples thereof include a cycloalkyl ring group.

$R_6$ represents a hydroxyl group or a fluorinated alcohol group (preferably a hexafluoroisopropanol group). Furthermore, in a case where $R_6$ is a hydroxyl group, $L_3$ is preferably the (n+m+1)-valent aromatic hydrocarbon ring group.

$R_7$ represents a halogen atom. Examples of the halogen atom include a fluorine atom, a chlorine atom, a bromine atom, and an iodine atom.

m represents an integer of 1 or more. m is preferably an integer of 1 to 3 and more preferably an integer of 1 or 2.

n represents 0 or an integer of 1 or more. n is preferably an integer of 1 to 4.

Furthermore, (n+m+1) is preferably an integer of 1 to 5.

As the repeating unit having an acid group, a repeating unit represented by General Formula (I) is also preferable.

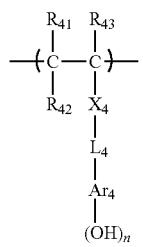

(I)

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

$Ar_4$ represents an (n+1)-valent aromatic ring group. The divalent aromatic ring group in a case where n is 1 may have a substituent, and is preferably, for example, an arylene group having 6 to 18 carbon atoms, such as a phenylene group, a tolylene group, a naphthylene group, and an anthracenylene group, or an aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or more include groups formed by removing any (n–1) hydrogen atoms from the above-described specific examples of the divalent aromatic ring group. The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in General Formula (I).

Examples of the alkyl group of $R_{64}$ in —CONR$_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

Specific examples of the repeating unit represented by General Formula (I) will be shown below, but the present invention is not limited thereto. In the formulae, a represents 1 or 2.

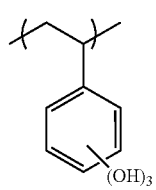

(B-1)

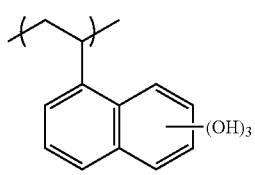
(B-2)
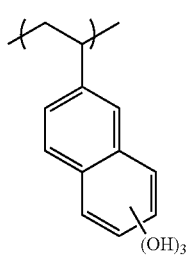
(B-3)
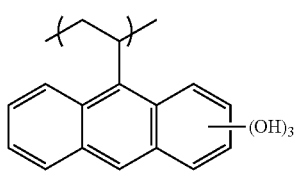
(B-4)
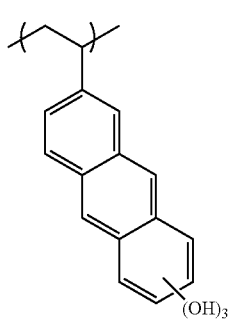
(B-5)
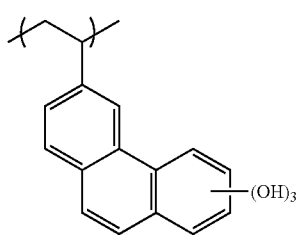
(B-6)
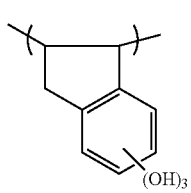
(B-7)
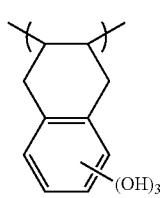
(B-8)
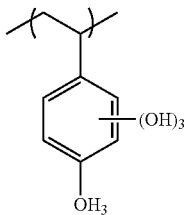
(B-9)
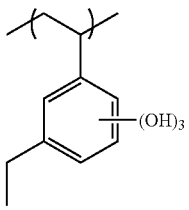
(B-10)
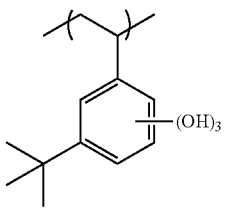
(B-11)
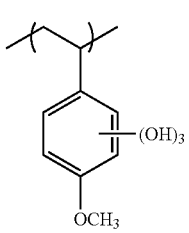
(B-12)
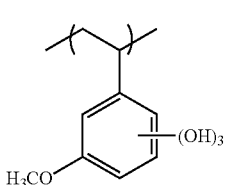
(B-13)
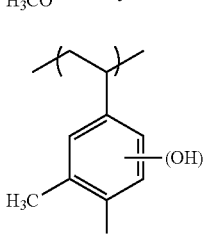
(B-14)
(B-15)

(B-16) 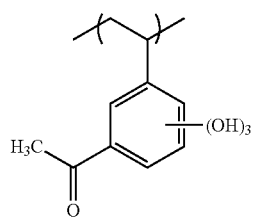
(B-17) 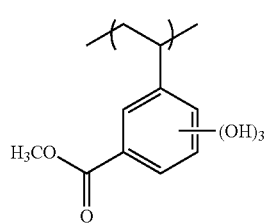
(B-18) 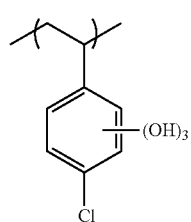
(B-19) 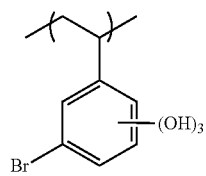
(B-20) 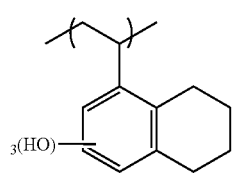
(B-21) 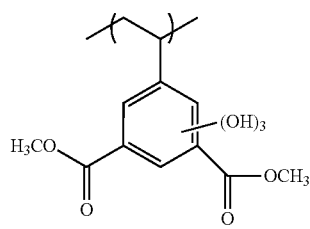
(B-22) 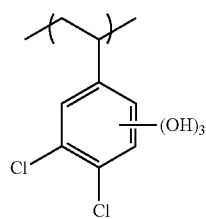
(B-23) 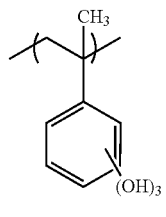
(B-24) 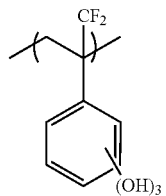
(B-25) 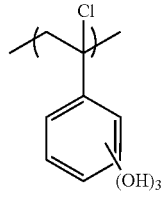
(B-26) 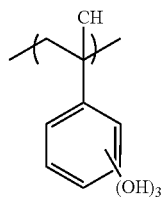
(B-27) 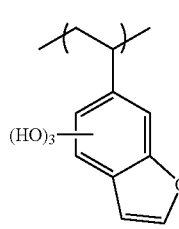
(B-28) 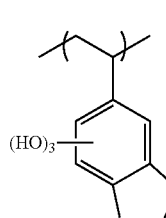
(B-29) 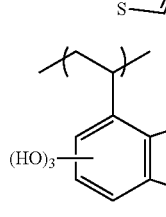

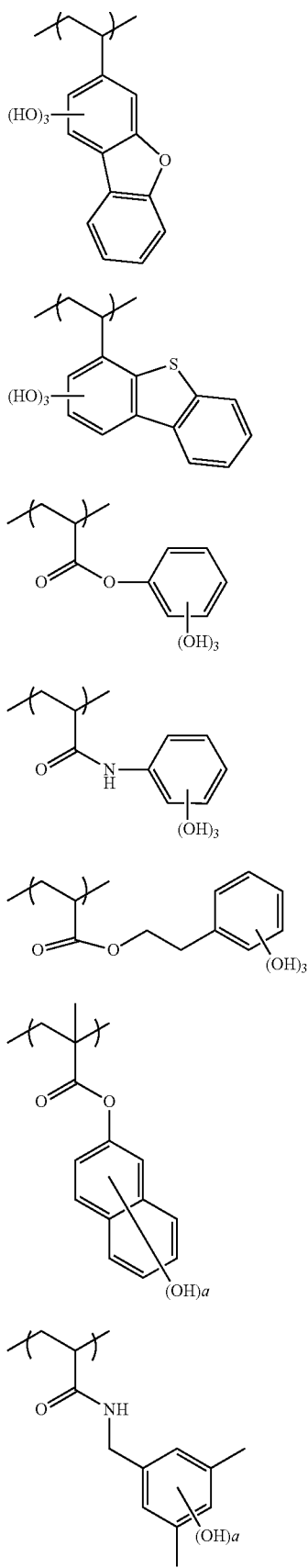

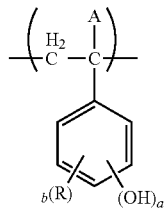

(Repeating Unit Derived from Hydroxystyrene (A-1))

The resin (A) preferably has a repeating unit (A-1) derived from hydroxystyrene as the repeating unit having an acid group.

Examples of the repeating unit (A-1) derived from hydroxystyrene include a repeating unit represented by General Formula (1).

$$\left(\begin{array}{c} H_2 \\ C \end{array} - \begin{array}{c} A \\ C \end{array}\right) \quad (1)$$

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be bonded to each other to form a ring. As R, the hydrogen atom is preferable.

a represents an integer of 1 to 3, and b represents an integer of 0 to (5-a).

As the repeating unit (A-1), a repeating unit represented by General Formula (A-I) is preferable.

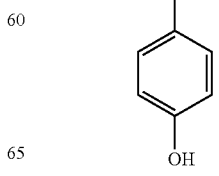

(A-I)

The composition including the resin (A) having the repeating unit (A-1) is preferable for KrF exposure, EB exposure, or EUV exposure. A content of the repeating unit (A-1) in such a case is preferably 30% to 100% by mole, more preferably 40% to 100% by mole, and still more preferably 50% to 100% by mole with respect to all repeating units in the resin (A).

(Repeating Unit (A-2) Having at Least One Selected from Group Consisting of Lactone Structure, Sultone Structure, Carbonate Structure, and Hydroxyadamantane Structure)

The resin (A) may have a repeating unit (A-2) having at least one selected from the group consisting of a lactone structure, a carbonate structure, a sultone structure, and a hydroxyadamantane structure.

The lactone structure or the sultone structure in a repeating unit having the lactone structure or the sultone structure is not particularly limited, but is preferably a 5- to 7-membered ring lactone structure or a 5- to 7-membered ring sultone structure, and more preferably a 5- to 7-membered ring lactone structure to which another ring structure is fused to form a bicyclo structure or a spiro structure, or a 5- to 7-membered ring sultone structure to which another ring structure is fused so as to form a bicyclo structure or a spiro structure.

Examples of the repeating unit having the lactone structure or the sultone structure include the repeating units described in paragraphs 0094 to 0107 of WO2016/136354A.

The resin (A) may have a repeating unit having a carbonate structure. The carbonate structure is preferably a cyclic carbonic acid ester structure.

Examples of the repeating unit having a carbonate structure include the repeating unit described in paragraphs 0106 to 0108 of WO2019/054311A.

The resin (A) may have a repeating unit having a hydroxyadamantane structure. Examples of the repeating unit having a hydroxyadamantane structure include a repeating unit represented by General Formula (AIIa).

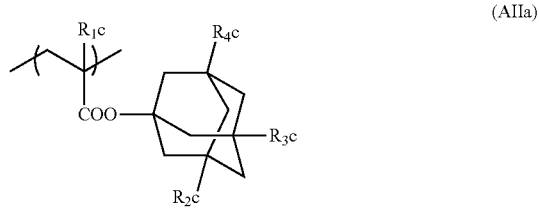

(AIIa)

In General Formula (AIIa), $R_1c$ represents a hydrogen atom, a methyl group, a trifluoromethyl group, or a hydroxymethyl group. $R_2c$ to $R_4c$ each independently represent a hydrogen atom or a hydroxyl group. It should be noted that at least one of $R_2c$, . . . , or $R_4c$ represents a hydroxyl group. It is preferable that one or two of $R_2c$ to $R_4c$ are hydroxyl groups, and the rest are hydrogen atoms.

(Repeating Unit Having Fluorine Atom or Iodine Atom)

The resin (A) may have a repeating unit having a fluorine atom or an iodine atom.

Examples of the repeating unit having a fluorine atom or an iodine atom include the repeating units described in paragraphs 0080 and 0081 of JP2019-045864A.

(Repeating Unit Having Photoacid Generating Group)

The resin (A) may have, as a repeating unit other than those above, a repeating unit having a group that generates an acid upon irradiation with radiation.

Examples of the repeating unit having a fluorine atom or an iodine atom include the repeating units described in paragraphs 0092 to 0096 of JP2019-045864A.

(Repeating Unit Having Alkali-Soluble Group)

The resin (A) may have a repeating unit having an alkali-soluble group.

Examples of the alkali-soluble group include a carboxyl group, a sulfonamide group, a sulfonylimide group, a bis-sulfonylimide group, and an aliphatic alcohol group (for example, a hexafluoroisopropanol group) in which the α-position is substituted with an electron-withdrawing group, and the carboxyl group is preferable.

By allowing the resin (A) to have a repeating unit having an alkali-soluble group, the resolution for use in contact holes increases.

Examples of the repeating unit having an alkali-soluble group include a repeating unit in which an alkali-soluble group is directly bonded to the main chain of a resin such as a repeating unit with acrylic acid and methacrylic acid, or a repeating unit in which an alkali-soluble group is bonded to the main chain of the resin through a linking group. Furthermore, the linking group may have a monocyclic or polycyclic cyclic hydrocarbon structure.

The repeating unit having an alkali-soluble group is preferably a repeating unit with acrylic acid or methacrylic acid.

(Repeating Unit Having Neither Acid-Decomposable Group nor Polar Group)

The resin (A) may further have a repeating unit having neither an acid-decomposable group nor a polar group. The repeating unit having neither an acid-decomposable group nor a polar group preferably has an alicyclic hydrocarbon structure.

Examples of the repeating unit having neither an acid-decomposable group nor a polar group include the repeating units described in paragraphs 0236 and 0237 of US2016/0026083A and the repeating units described in paragraph 0433 of US2016/0070167A.

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

(Characteristics of Resin (A))

In the resin (A), all repeating units are preferably composed of repeating units derived from a (meth)acrylate-based monomer (monomer having a (meth)acryl group). In this case, any of a resin in which all repeating units are derived from a methacrylate-based monomer, a resin in which all repeating units are derived from an acrylate-based monomer, and a resin in which all repeating units are derived from a methacrylate-based monomer and an acrylate-based monomer may be used. The repeating units derived from the acrylate-based monomer are preferably 50% by mole or less with respect to all repeating units in the resin (A).

In a case where the composition is for argon fluoride (ArF) exposure, it is preferable that the resin (A) does not substantially have an aromatic group from the viewpoint of the transmittance of ArF light. More specifically, the repeating unit having an aromatic group is preferably 5% by mole or less, more preferably 3% by mole or less, and ideally 0% by mole with respect to all repeating units in the resin (A), that is, it is still more preferable that the repeating unit having an aromatic group is not included.

In addition, in a case where the composition is for ArF exposure, the resin (A) preferably has a monocyclic or polycyclic alicyclic hydrocarbon structure, and preferably does not include either a fluorine atom or a silicon atom.

In a case where the composition is for krypton fluoride (KrF) exposure, EB exposure, or EUV exposure, the resin (A) preferably has a repeating unit having an aromatic hydrocarbon group, and more preferably has a repeating unit having a phenolic hydroxyl group.

Examples of the repeating unit having a phenolic hydroxyl group include a repeating unit derived from hydroxystyrene (A-1) and a repeating unit derived from hydroxystyrene (meth)acrylate.

In addition, in a case where the composition is for KrF exposure, EB exposure, or EUV exposure, it is also preferable that the resin (A) has a repeating unit having a structure in which a hydrogen atom of the phenolic hydroxyl group is protected by a group (leaving group) that leaves through decomposition by the action of an acid.

In a case where the composition is for KrF exposure, EB exposure, or EUV exposure, a content of the repeating unit having an aromatic hydrocarbon group included in the resin (A) is preferably 30% to 100% by mole, more preferably 40% to 100% by mole, and still more preferably 50% to 100% by mole, with respect to all repeating units in the resin (A).

The resin (A) can be synthesized in accordance with an ordinary method (for example, radical polymerization).

The weight-average molecular weight (Mw) of the resin (A) is preferably 1,000 to 200,000, more preferably 3,000 to 20,000, and still more preferably 5,000 to 15,000. By setting the weight-average molecular weight (Mw) of the resin (A) to 1,000 to 200,000, it is possible to prevent deterioration of heat resistance and dry etching resistance, and it is also possible to prevent deterioration of the film forming property due to deterioration of developability and an increase in the viscosity. Incidentally, the weight-average molecular weight (Mw) of the resin (A) is a value expressed in terms of polystyrene as measured by the above-mentioned GPC method.

The dispersity (molecular weight distribution) of the resin (A) is usually 1 to 5, preferably 1 to 3, and more preferably 1.1 to 2.0. The smaller the dispersity, the better the resolution and the resist shape, and the smoother the side wall of a pattern, the more excellent the roughness.

In the composition of the embodiment of the present invention, a content of the resin (A) is preferably 50% to 99.9% by mass, and more preferably 60% to 99.0% by mass with respect to the total solid content of the composition.

In addition, the resin (A) may be used alone or in combination of two or more kinds thereof.

Furthermore, in the present specification, the solid content means a component that can form a resist film excluding the solvent. Even in a case where the properties of the components are liquid, they are treated as solid contents.

<Acid Generator>

The composition of the embodiment of the present invention includes an acid generator.

As the acid generator, a photoacid generator (P) is preferable. The photoacid generator (P) is not particularly limited as long as it is a compound that generates an acid upon irradiation with radiation.

The photoacid generator (P) may be in a form of a low-molecular-weight compound or a form incorporated into a part of a polymer. In addition, a combination of the form of a low-molecular-weight compound and the form incorporated into a part of a polymer may also be used.

In a case where the photoacid generator (P) is in the form of the low-molecular-weight compound, the weight-average molecular weight (Mw) is preferably 3,000 or less, more preferably 2,000 or less, and still more preferably 1,000 or less.

In a case where the photoacid generator (P) is in the form incorporated into a part of a polymer, it may be incorporated into the part of the resin (A) or into a resin that is different from the resin (A).

In the present invention, the photoacid generator (P) is preferably in the form of a low-molecular-weight compound.

The photoacid generator (P) is not particularly limited as long as it is a known one, but a compound that generates an organic acid upon irradiation with radiation is preferable, and a photoacid generator having a fluorine atom or an iodine atom in the molecule is more preferable.

Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkylcarboxylic acid), a carbonylsulfonylimide acid, a bis(alkylsulfonyl)imide acid, and a tris(alkylsulfonyl)methide acid.

The volume of an acid generated from the photoacid generator (P) is not particularly limited, but from the viewpoint of suppression of diffusion of an acid generated to the unexposed area upon exposure and improvement of the resolution, the volume is preferably 240 $Å^3$ or more, more preferably 305 $Å^3$ or more, and still more preferably 350 $Å^3$ or more, and particularly preferably 400 $Å^3$ or more. Incidentally, from the viewpoint of the sensitivity or the solubility in an application solvent, the volume of the acid generated from the photoacid generator (P) is preferably 1,500 $Å^3$ or less, more preferably 1,000 $Å^3$ or less, and still more preferably 700 $Å^3$ or less.

The value of the volume is obtained using "WinMOPAC" manufactured by Fujitsu Limited. For the computation of the value of the volume, first, the chemical structure of an acid according to each example is input, next, using this structure as an initial structure, the most stable conformation of each acid is determined by molecular force field computation using a molecular mechanics (MM) 3 method, and thereafter with respect to the most stable conformation, molecular orbital calculation using a parameterized model number (PM) 3 method is performed, whereby the "accessible volume" of each acid can be computed.

The structure of an acid generated from the photoacid generator (P) is not particularly limited, but from the viewpoint that the diffusion of the acid is suppressed and the resolution is improved, it is preferable that the interaction between the acid generated from the photoacid generator (P) and the resin (A) is strong. From this viewpoint, in a case where the acid generated from the photoacid generator (P) is an organic acid, it is preferable that a polar group is further contained, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto group.

The number of the polar groups contained in the acid generated is not particularly limited, and is preferably 1 or more, and more preferably 2 or more. It should be noted that from the viewpoint that excessive development is suppressed, the number of the polar groups is preferably less than 6, and more preferably less than 4.

Among those, the photoacid generator (P) is preferably a photoacid generator consisting of an anionic moiety and a cationic moiety from the viewpoint that the effect of the present invention is more excellent.

Examples of the photoacid generator (P) include the photoacid generators described in paragraphs 0144 to 0173 of JP2019-045864A.

As described above, the ratio c of the content of the photoacid generator (P) to the total mass of the resist composition is 0.3% to 2.5% by mass. The ratio c is preferably 0.35% to 2.0% by mass, and more preferably 0.50 to 1.5% by mass.

In addition, the content of the photoacid generator (P) is preferably 0.1% to 20% by mass, more preferably 0.3% to 10% by mass, and still more preferably 0.5% to 5% by mass with respect to the total solid content of the composition.

The photoacid generators (P) may be used alone or in combination of two or more kinds thereof. In a case where two or more kinds of the photoacid generators (P) are used in combination, the total amount thereof is preferably within the range.

<Solvent (F)>

The composition of the embodiment of the present invention includes a solvent (F).

In a case where the composition of the embodiment of the present invention is a radiation-sensitive resin composition for EUV, it is preferable that the solvent (F) includes at least one solvent of (M1) propylene glycol monoalkyl ether carboxylate or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate. The solvent in this case may further include components other than the components (M1) and (M2).

The solvent including the component (M1) or (M2) is preferable since a use of the solvent in combination with the above-mentioned resin (A) makes it possible to form a pattern having a small number of development defects while improving the coating property of the composition.

In a case where the composition of the embodiment of the present invention is a radiation-sensitive resin composition for ArF, examples of the solvent (F) include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may include a ring, alkylene carbonate, alkyl alkoxyacetate, and alkyl pyruvate.

A content of the solvent (F) in the composition of the embodiment of the present invention is preferably set such that the concentration of solid contents is 0.5% to 40% by mass.

Among those, the concentration of solid contents is preferably 10% by mass or more.

<Acid Diffusion Control Agent (Q)>

The composition of the embodiment of the present invention may include an acid diffusion control agent (Q).

The acid diffusion control agent (Q) acts as a quencher that suppresses a reaction of an acid-decomposable resin in the unexposed area by excessive generated acids by trapping the acids generated from a photoacid generator (P) and the like upon exposure. For example, a basic compound (DA), a basic compound (DB) having basicity reduced or lost upon irradiation with radiation, an onium salt (DC) which is a relatively weak acid with respect to the photoacid generator (P), a low-molecular-weight compound (DD) having a nitrogen atom, and a group that leaves by the action of an acid, an onium salt compound (DE) having a nitrogen atom in the cationic moiety, can be used as the acid diffusion control agent (Q).

In the composition of the embodiment of the present invention, a known acid diffusion control agent can be appropriately used. For example, the known compounds disclosed in paragraphs [0627] to [0664] of US2016/0070167A, paragraphs [0095] to [0187] of US2015/0004544A, paragraphs [0403] to [0423] of US2016/0237190A, and paragraphs [0259] to [0328] of US2016/0274458A can be suitably used as the acid diffusion control agent (Q).

Examples of the basic compound (DA) include the repeating units described in paragraphs 0188 to 0208 of JP2019-045864A.

In the composition of the embodiment of the present invention, the onium salt (DC) which is a relatively weak acid with respect to the photoacid generator (P) can be used as the acid diffusion control agent (Q).

In a case where the photoacid generator (P) and the onium salt that generates an acid which is a relatively weak acid with respect to an acid generated from the photoacid generator (P) are mixed and used, an acid generated from the photoacid generator (P) upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

Examples of the onium salt that is relatively weak acid with respect to the photoacid generator (P) include the onium salts described in paragraphs 0226 to 0233 of JP2019-070676A.

In a case where the composition of the embodiment of the present invention includes an acid diffusion control agent (Q), a content of the acid diffusion control agent (Q) (a total content in a case where a plurality of kinds of the acid diffusion control agents are present) is preferably 0.1% to 10.0% by mass, and more preferably 0.1% to 5.0% by mass, with respect to the total solid content of the composition.

In the composition of the embodiment of the present invention, the acid diffusion control agents (Q) may be used alone or in combination of two or more kinds thereof.

<Hydrophobic Resin (E)>

The composition of the embodiment of the present invention may include a hydrophobic resin different from the resin (A) as the hydrophobic resin (E).

Although it is preferable that the hydrophobic resin (E) is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect of addition of the hydrophobic resin (E) include a control of static and dynamic contact angles of a surface of the resist film with respect to water and suppression of out gas.

The hydrophobic resin (E) preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. Incidentally, the hydrophobic resin (E) preferably has a hydrocarbon group having 5 or more carbon atoms. These groups may be contained in the main chain of the resin or may be substituted in a side chain.

In a case where hydrophobic resin (E) includes a fluorine atom and/or a silicon atom, the fluorine atom and/or the silicon atom in the hydrophobic resin may be included in the main chain or a side chain of the resin.

In a case where the hydrophobic resin (E) contains a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and the alkyl group may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

Examples of the aryl group having a fluorine atom include an aryl group such as a phenyl group and a naphthyl group, in which at least one hydrogen atom is substituted with a fluorine atom, and the aryl group may further have a substituent other than a fluorine atom.

Examples of the repeating unit having a fluorine atom or a silicon atom include those exemplified in paragraph 0519 of US2012/0251948A.

Furthermore, as described above, it is also preferable that the hydrophobic resin (E) contains a $CH_3$ partial structure in a side chain moiety.

Here, the $CH_3$ partial structure contained in the side chain moiety in the hydrophobic resin includes a $CH_3$ partial structure contained in an ethyl group, a propyl group, and the like.

On the other hand, a methyl group bonded directly to the main chain of the hydrophobic resin (E) (for example, an α-methyl group in the repeating unit having a methacrylic acid structure) makes only a small contribution to uneven distribution on the surface of the hydrophobic resin (E) due to the effect of the main chain, and it is therefore not included in the $CH_3$ partial structure in the present invention.

With regard to the hydrophobic resin (E), reference can be made to the description in paragraphs 0348 to 0415 of JP2014-010245A, the contents of which are incorporated herein by reference.

Furthermore, the resins described in JP2011-248019A, JP2010-175859A, and JP2012-032544A can also be preferably used as the hydrophobic resin (E).

In a case where the composition of the embodiment of the present invention includes the hydrophobic resin (E), a content of the hydrophobic resin (E) is preferably 0.01% to 20% by mass, and more preferably 0.1% to 15% by mass with respect to the total solid content of the composition.

<Surfactant (H)>

The composition of the embodiment of the present invention may include a surfactant (H). By incorporating the surfactant (H), it is possible to form a pattern having more excellent adhesiveness and fewer development defects.

As the surfactant (H), fluorine-based and/or silicon-based surfactants are preferable.

Examples of the fluorine-based and/or silicon-based surfactant include the surfactants described in paragraph 0276 of US2008/0248425A. In addition, EFTOP EF301 or EF303 (manufactured by Shin-Akita Chemical Co., Ltd.); FLUO-RAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Corporation); or FTX-204G, 208G, 218G, 230G, 204D, 208D, 212D, 218D, or 222D (manufactured by NEOS COMPANY LIMITED) may be used.

In addition, a polysiloxane polymer, KP-341 (manufactured by Shin-Etsu Chemical Co., Ltd.), can also be used as the silicon-based surfactant.

Moreover, the surfactant (H) may be synthesized using a fluoroaliphatic compound manufactured using a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant (H). This fluoroaliphatic compound can be synthesized, for example, by the method described in JP2002-90991A.

As the polymer having a fluoroaliphatic group, a copolymer of a monomer having a fluoroaliphatic group and (poly(oxyalkylene))acrylate and/or (poly(oxyalkylene)) methacrylate is preferable, and the polymer may be unevenly distributed or block-copolymerized. Furthermore, examples of the poly(oxyalkylene) group include a poly (oxyethylene) group, a poly(oxypropylene) group, and a poly(oxybutylene) group, and the group may also be a unit such as those having alkylenes having different chain lengths within the same chain length such as poly(block-linked oxyethylene, oxypropylene, and oxyethylene) and poly(block-linked oxyethylene and oxypropylene). In addition, the copolymer of a monomer having a fluoroaliphatic group and (poly(oxyalkylene))acrylate (or methacrylate) is not limited only to a binary copolymer but may also be a ternary or higher copolymer obtained by simultaneously copolymerizing monomers having two or more different fluoroaliphatic groups or two or more different (poly(oxyalkylene)) acrylates (or methacrylates).

Examples of a commercially available surfactant thereof include MEGAFACE F178, F-470, F-473, F-475, F-476, and F-472 (manufactured by DIC Corporation), a copolymer of acrylate (or methacrylate) having a $C_6F_{13}$ group and (poly(oxyalkylene))acrylate (or methacrylate), and a copolymer of acrylate (or methacrylate) having a $C_3F_7$ group, (poly(oxyethylene))acrylate (or methacrylate), and (poly (oxypropylene))acrylate (or methacrylate).

In addition, a surfactant other than the fluorine-based surfactant and/or the silicon-based surfactants described in paragraph [0280] of US2008/0248425A may be used.

These surfactants (H) may be used alone or in combination of two or more kinds thereof.

The content of the surfactant (H) is preferably 0.0001% to 2% by mass and more preferably 0.0005% to 1% by mass with respect to the total solid content of the composition.

<Other Additives>

The composition of the embodiment of the present invention may further include a crosslinking agent, an alkali-soluble resin, a dissolution inhibiting compound, a dye, a plasticizer, a photosensitizer, a light absorber, and/or a compound that accelerates solubility in a developer.

EXAMPLES

Hereinbelow, the present invention will be described in more detail with reference to Examples. The materials, the amounts of materials used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below.

[Preparation of Each Component]

<Synthesis of Resin (A)>

In Examples and Comparative Examples, resins A-1 to A-20 exemplified below were used as the resin (A). As the resins A-1 to A-20, those synthesized based on known techniques were used.

The compositional ratio (molar ratio; corresponding in order from the left), the weight-average molecular weight (Mw), and the dispersity (Mw/Mn) of each repeating unit in the resin (A) are shown in Table 1.

Furthermore, the weight-average molecular weight (Mw) and the dispersity (Mw/Mn) of the resins A-1 to A-20 are values expressed in terms of polystyrenes, as measured by the above-mentioned GPC method (carrier: tetrahydrofuran (THF)). In addition, the compositional ratios (ratios in % by mole) of the repeating units in the resin were measured by means of $^{13}$C-nuclear magnetic resonance (NMR).

TABLE 1

| Resin | Molar ratio of repeating unit | | | | Mw | Mw/Mn |
|---|---|---|---|---|---|---|
| A-1 | 64 | 18 | 18 | | 21,000 | 1.5 |
| A-2 | 62 | 13 | 20 | 5 | 13,000 | 1.3 |
| A-3 | 75 | 20 | 5 | | 10,000 | 1.4 |
| A-4 | 40 | 18 | 42 | | 28,000 | 1.9 |
| A-5 | 70 | 25 | 5 | | 7,000 | 1.7 |
| A-6 | 53 | 12 | 35 | | 15,000 | 1.6 |
| A-7 | 70 | 12 | 18 | | 17,000 | 1.6 |
| A-8 | 60 | 20 | 20 | | 12,000 | 2.8 |
| A-9 | 75 | 25 | | | 21,000 | 1.3 |
| A-10 | 75 | 25 | | | 21,000 | 1.3 |
| A-11 | 65 | 25 | 10 | | 21,000 | 1.3 |
| A-12 | 68 | 25 | 7 | | 21,000 | 1.9 |
| A-13 | 65 | 25 | 10 | | 21,000 | 1.4 |
| A-14 | 55 | 35 | 10 | | 21,000 | 1.4 |
| A-15 | 65 | 25 | 10 | | 21,000 | 1.3 |
| A-16 | 65 | 25 | 10 | | 21,000 | 1.3 |
| A-17 | 65 | 25 | 10 | | 21,000 | 1.3 |
| A-18 | 40 | 50 | 10 | | 13,000 | 1.4 |
| A-19 | 65 | 15 | 20 | | 10,000 | 2.5 |
| A-20 | 68 | 22 | 10 | | 25,000 | 1.5 |

(A-1)

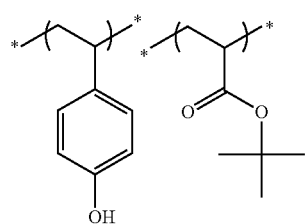

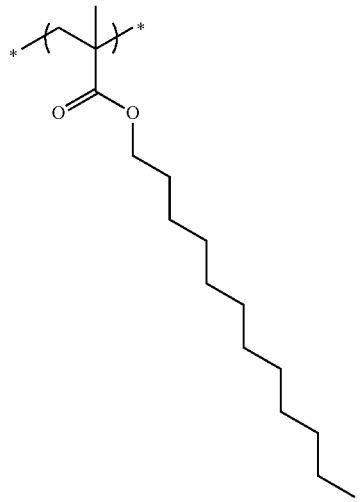

(A-2)

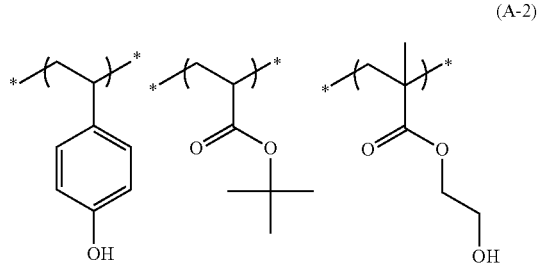

(A-3)

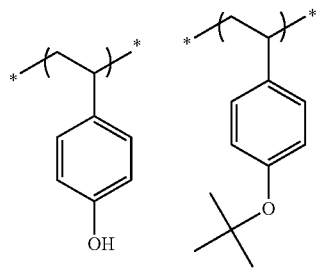

(A-4)
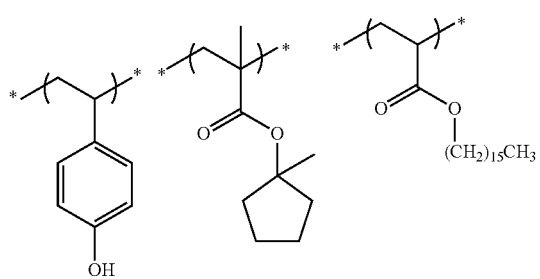
(A-5)
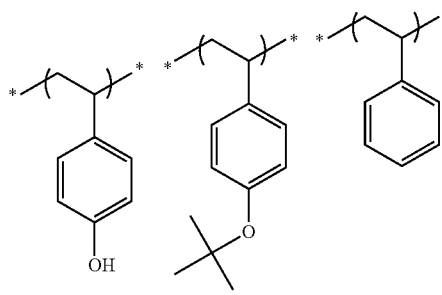
(A-6)
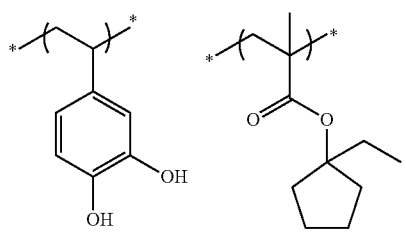
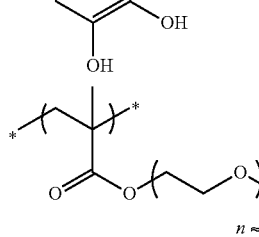
$n \approx 2$
(A-7)
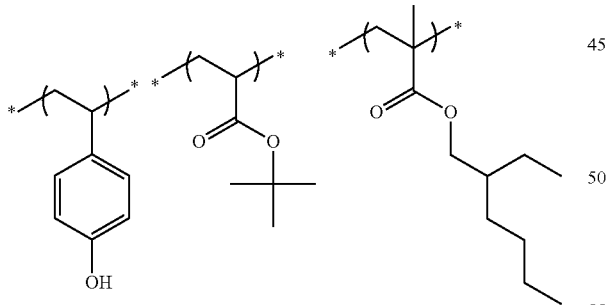
(A-8)
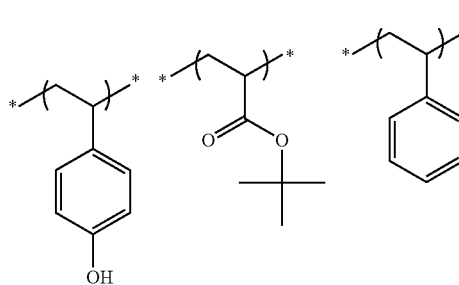
(A-9)
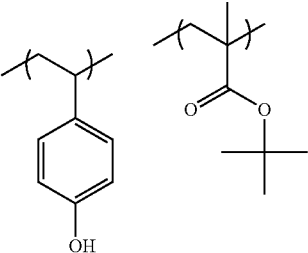
(A-10)
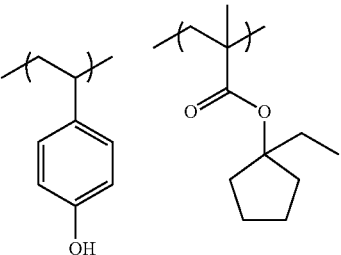
(A-11)
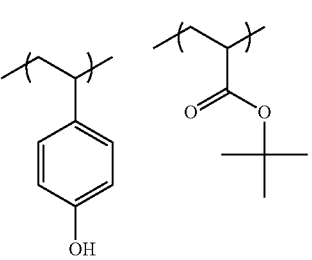
(A-12)
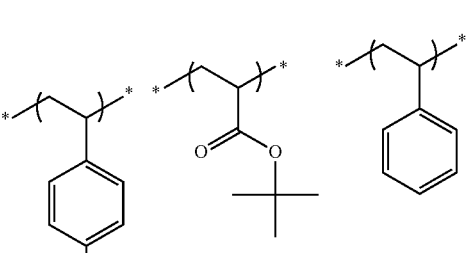
(A-13)
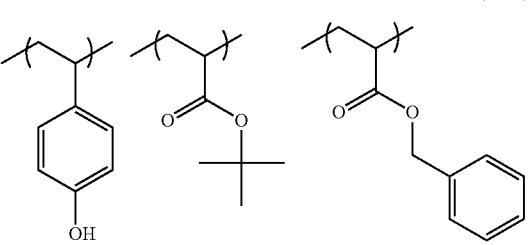
(A-14)
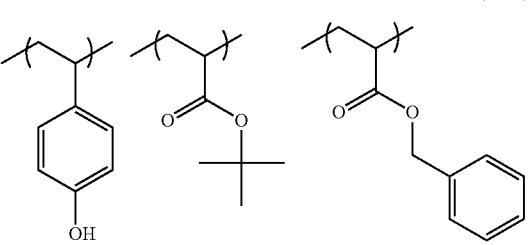

-continued
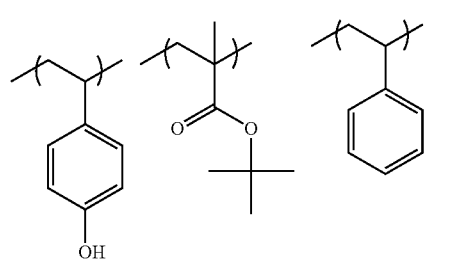
(A-15)
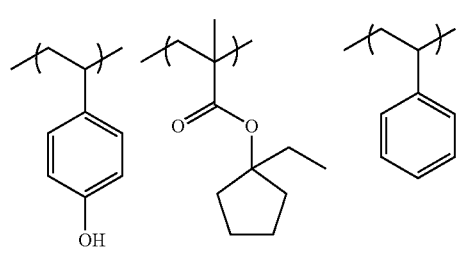
(A-16)
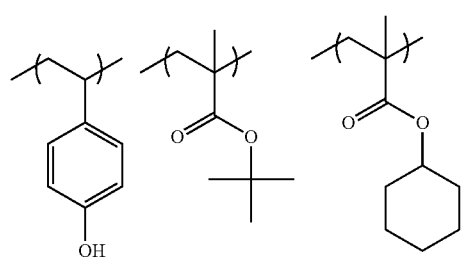
(A-17)
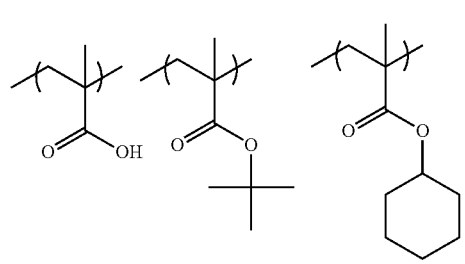
(A-18)
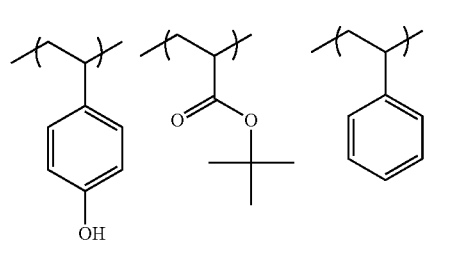
(A-19)
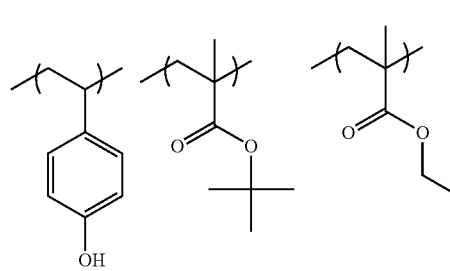
(A-20)
<Photoacid Generator>
The structures of the compounds P-1 to P-19 used as the photoacid generator in Examples and Comparative Examples are shown below.
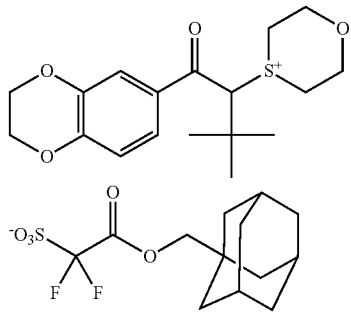
(P-1)
(P-2)
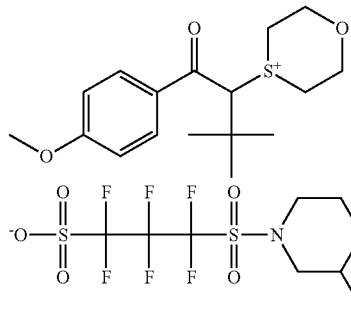
(P-3)
$C_4F_2SO_3^-$
(P-4)
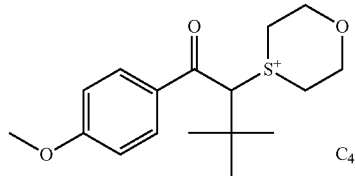
(P-5)
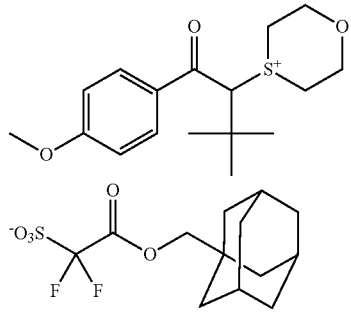
(P-6)
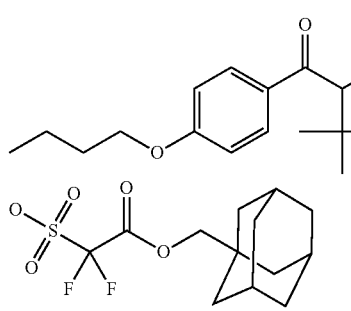

(P-7)
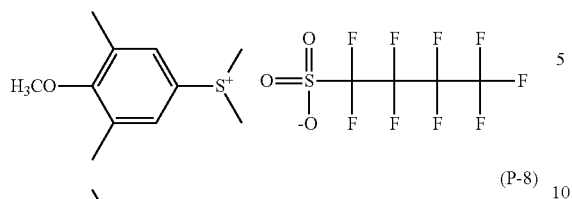
(P-8)
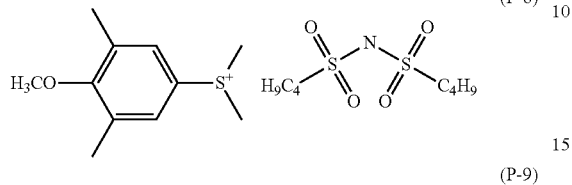
(P-9)
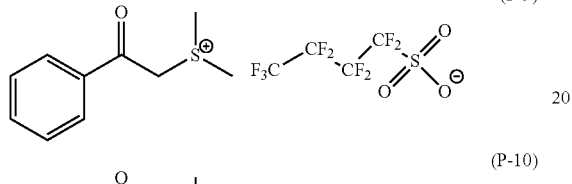
(P-10)
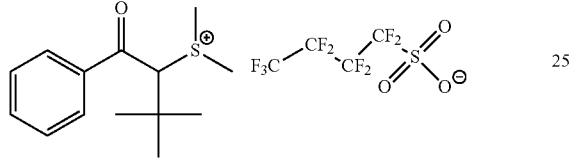
(P-11)
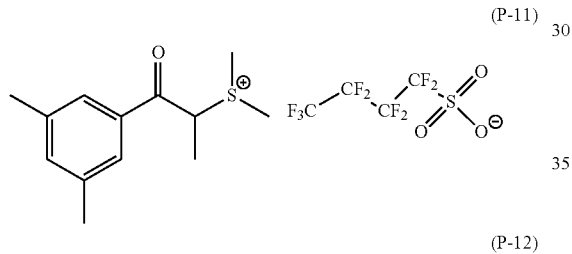
(P-12)
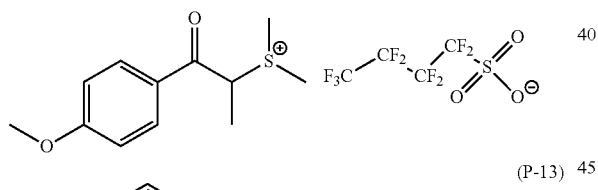
(P-13)
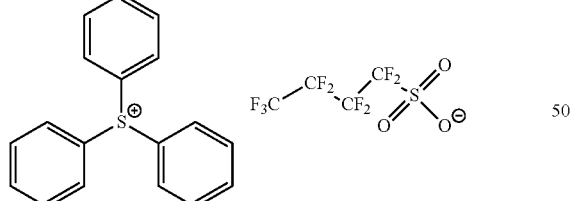
(P-14)
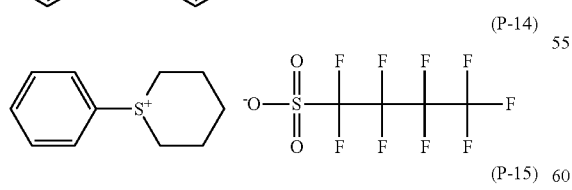
(P-15)
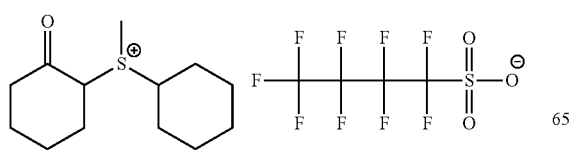
(P-16)
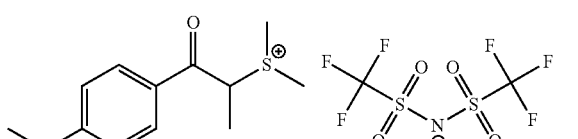
(P-17)
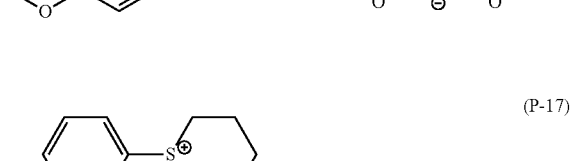
(P-18)
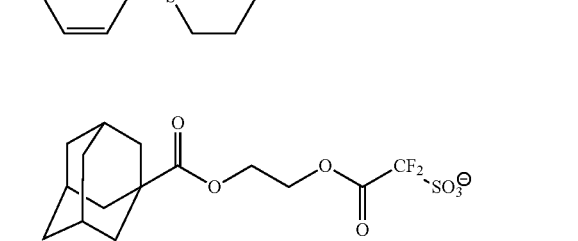
(P-19)
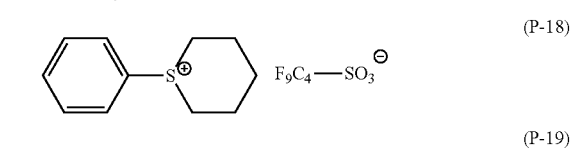
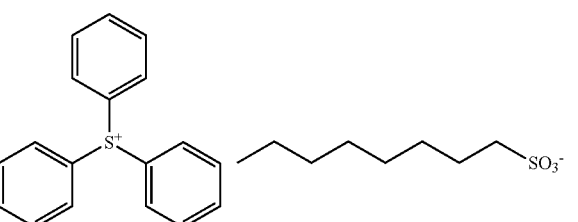
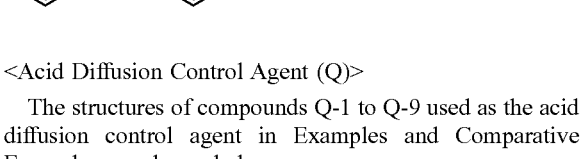
<Acid Diffusion Control Agent (Q)>
The structures of compounds Q-1 to Q-9 used as the acid diffusion control agent in Examples and Comparative Examples are shown below.
(Q-1)
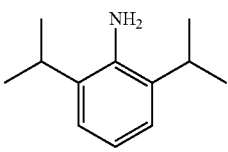
(Q-2)
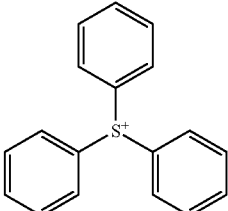
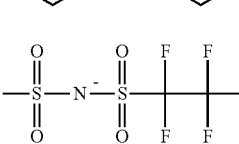

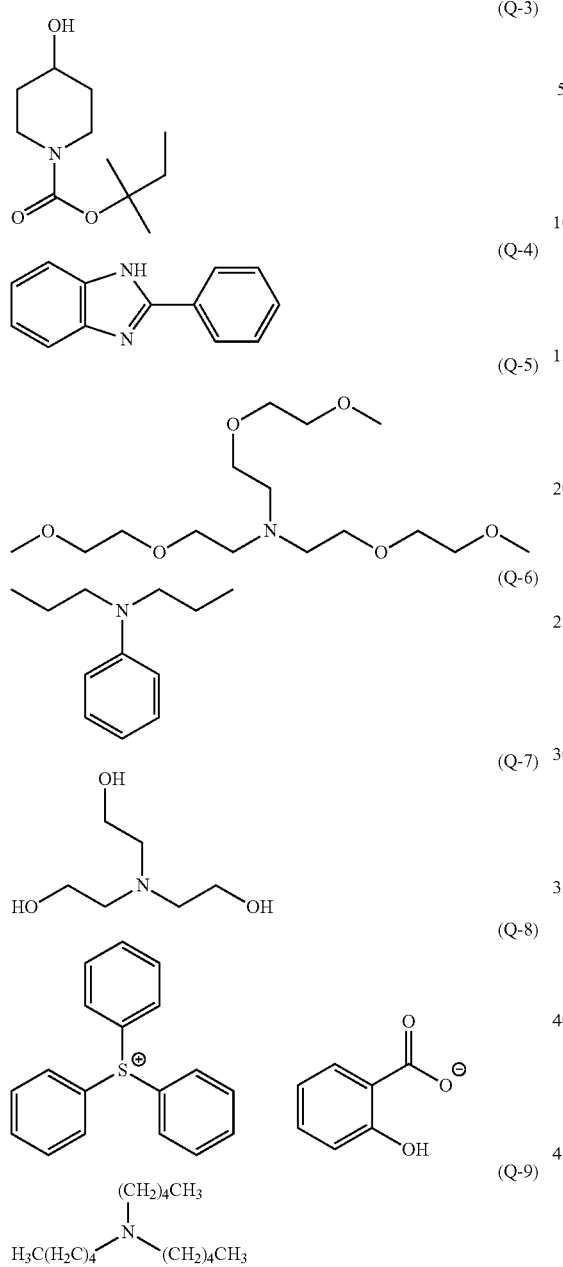

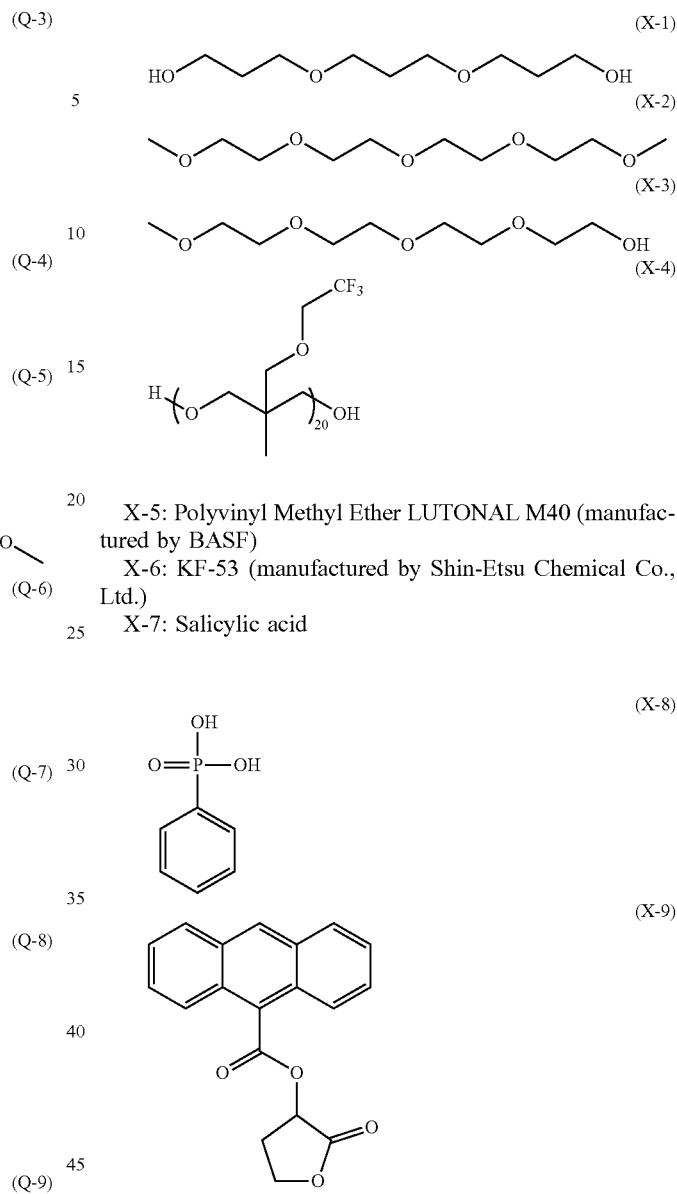

X-5: Polyvinyl Methyl Ether LUTONAL M40 (manufactured by BASF)
X-6: KF-53 (manufactured by Shin-Etsu Chemical Co., Ltd.)
X-7: Salicylic acid <Solvent>
Solvents used in Examples and Comparative Examples are shown below.
PGMEA: Propylene glycol monomethyl ether acetate
PGME: Propylene glycol monomethyl ether
EL: Ethyl lactate
BA: Butyl acetate
MAK: 2-Heptanone
MMP: Methyl 3-methoxypropionate
<Surfactant (H)>
Surfactants used in Examples and Comparative Examples are shown below.
H-1: MEGAFACE R-41 (manufactured by DIC Corporation)
<Additive (X)>
Additives used in Examples and Comparative Examples are shown below.

Examples and Comparative Examples

<Preparation of Resist Composition>
An operation which will be described later was carried out in a clean room of Class 6 (class notation of International Organization for Standardization ISO 14644-1) at a temperature of 22.0° C., a humidity of 58%, and an atmospheric pressure of 102.6 kPa.
Specifically, resist compositions shown in Table 2 which will be described later were produced by the following procedure using the production device 100 shown in FIG. 1.
(Mixing Step)
Each component was charged into a stirring tank (capacity of 200 L) arranged in a clean room so as to have a composition of the resist composition (resists 1 to 18) shown in Table 3 which will be described later, and a mixing step of obtaining a mixture was carried out. At that time, with regard to the charge of a solvent, the solvent was passed through a polyethylene filter having a pore size of 3 nm and charged into the stirring tank. In addition, with regard to the charge of the components other than the solvent, first, a part of the solvent used for preparing each resist composition was passed through a polyethylene filter having a pore size of 3 nm, and each component was dissolved in the solvent which had been passed therethrough to prepare a diluted solution. Thereafter, the obtained diluted solution was passed through a filter and charged into a stirring tank.

The dilution concentration of the diluted solution and the type of filter were changed according to the components to be passed.

Specifically, in a case where it was intended to prepare the resist compositions (resists 1 to 18) in Table 3, the dilution concentration of the diluted solution in which the resin was dissolved was 50% by mass, and the dilution concentration of the diluted solution in which the other materials (the photoacid generator, the acid diffusion control agent, the additive 1, and the additive 2) were dissolved was 20% by mass. In addition, for the diluted solutions in which the resins were dissolved, a polyethylene filter having a pore size of 0.1 μm was used; and for the diluted solutions in which the other materials (the photoacid generator, the acid diffusion control agent, the additive 1, and the additive 2), a polyethylene filter having a pore size of 0.05 μm was used. Furthermore, the resists 1 to 18 were used to form a resist film for KrF exposure, as described later.

(Stirring Step)

Next, the mixture obtained in the mixing step was stirred using a stirring device having the configuration shown in Table 2 which will be described later. The temperature of the mixture at the time of stirring was 22° C.

The configurations of the stirring device (the stirrer and the stirring tank) used in each stirring step and the stirring conditions are shown in Table 2.

TABLE 2

| | Stirring device | | | | |
|---|---|---|---|---|---|
| | Stirring element | Position of stirring element | Number of baffle plates | Inclination of stirring shaft | Stirring condition |
| Stirring step H1 | Paddle blade | Center | 0 | 0° | Condition 1 |
| Stirring step H2 | Propeller blade | Center | 0 | 0° | Condition 1 |
| Stirring step J1 | Conical tubular element | Center | 0 | 0° | Condition 1 |
| Stirring step J2 | Conical tubular element | ¼ from center | 0 | 0° | Condition 1 |
| Stirring step J3 | Conical tubular element | ¼ from center | 0 | 20° | Condition 1 |
| Stirring step J4 | Conical tubular element | ¼ from center | 0 | 0° | Condition 2 |
| Stirring step J5 | Conical tubular element | ¼ from center | 0 | 0° | Condition 3 |
| Stirring step J6 | Conical tubular element | ¼ from center | 4 | 0° | Condition 1 |
| Stirring step J7 | Conical tubular element | ¼ from center | 4 | 20° | Condition 3 |

In Table 2, the "Stirring element" column shows the type of stirring element included in the stirrer used in each stirring step. Specifically, the "Paddle blade" indicates that a stirrer provided with four paddle blades was used. The "Propeller blade" indicates that a stirrer provided with three propeller blades was used. The "Conical tubular element" indicates that the stirrer 20 including four stirring elements 26 shown in FIG. 2 was used.

In Table 2, the "Position of stirring element" column shows the position of the point C1 at which the distances from the stirring elements are the same and the shortest. Specifically, the "Center" means that the point C1 coincides with the point C2 located at the center of an inner peripheral surface of the stirring tank in a cross-section in the horizontal direction including the point C1, and the "¼ from center" indicates that the distance between the point C1 and the point C2 is ¼ of the shortest distance from the point C2 to an inner peripheral surface of the stirring tank (½ of the inner diameter d2 of the inner peripheral surface).

In Table 2, the "Number of baffle plates" column shows the number of baffle plates provided on an inner peripheral surface of the stirring tank. Specifically, a case where the "Number of baffle plates" column is "0" means that the stirring tank does not have a baffle plate, and a case where the "Number of baffle plates" column is "4" means that the stirring tank is provided with four flat plate-shaped baffle plates extending in the vertical direction as shown in FIG. 1.

In Table 2, the "Inclination of stirring shaft" column shows an angle α between the axial direction and the vertical direction of the stirring shaft.

In Table 2, the "Stirring condition" column shows a rotation speed (unit: rpm) of the stirring shaft contained in the stirrer set in a case where the stirring step is carried out. Specifically, in "Condition 1", the stirring shaft was rotated at a rotation speed of 200 rpm. In "Condition 2", a period in which the stirring shaft was rotated at a rotation speed of 200 rpm for 3 hours and a period in which the stirrer was stopped for 1 hour were repeated. In "Condition 3", a period in which the stirring shaft was rotated at a rotation speed of 200 rpm for 20 minutes and a period in which the stirring shaft was rotated at a rotation speed of 100 rpm for 20 minutes were repeated.

The stirring steps carried out in each Example, each Comparative Example, and each Reference Example are shown in Table 4 which will be described later. In addition, in each stirring step, the position in the vertical direction of the stirrer was adjusted such that a ratio h of an average value of the depths from the plurality of stirring elements to the bottom part of the stirring tank to a depth from a liquid level of the mixture accommodated in the stirring tank to the bottom part of the stirring tank corresponds to the numerical value described in the "Ratio h" column in Table 4.

Under the conditions, the mixture obtained in the mixing step was stirred using a stirrer. After the stirring step was carried out for 12 hours, the stirring step was completed.

(Circulation-Filtering Step)

After completion of the stirring step, a discharge valve provided at the bottom part of the stirring tank 12 and a valve arranged on the circulation pipe 42 connected to the discharge valve were sequentially opened, and the mixture in the stirring tank 12 was fed to the circulation pipe 42, using a liquid feeding pump. As a result, the circulation-filtering step in which the mixture was circulated in the inside of the circulation pipe 42 and repeatedly passed through the filter 44 arranged on the circulation pipe 42 was carried out. This circulation-filtering step was carried out until an integrated value of the liquid amounts of the mixture that had passed through the filter 44 exceeded four times the liquid amount of the mixture accommodated in the stirring tank 12 before the start of the circulation-filtering step.

In the circulation-filtering step, a 2-stage filter composed of a filter consisting of nylon 66 having a pore size of 0.02 μm and a polyethylene filter having a pore size of 0.01 μm was used as the filter 44.

After closing the valve arranged in a return path of the circulation pipe 42, a valve arranged in the discharge pipe 46 and a discharge valve were sequentially opened, and a resist composition thus obtained was filled via the discharge pipe 46 and the discharge valve.

The container accommodating the resist composition produced by the method was stored in a constant-temperature tank at 35° C. for 1 month, and subjected to a KrF exposure experiment which will be described later.

The composition of the resist composition and the conditions for forming a resist film in the KrF exposure experiment which will be described later are shown in Table 3.

In Table 3, "TMAH (2.38%)" in the "Developer" column represents an aqueous solution having a content of tetramethylammonium hydroxide of 2.38% by mass.

In Table 3, the "Content" column of each component shows the content (% by mass) of each component with respect to the total solid content in the resist composition.

In Table 3, the "Ratio c" column of "Photoacid generator" shows a ratio c (% by mass) of the content of the photoacid generator to the total mass of the resist composition (a total content of photoacid generators in a case where two kinds of photoacid generators are used).

In Table 3, the numerical value in the "Solvent" column shows a mass ratio of the contents of the respective components.

In Table 3, the "Solid content" column shows a total concentration (% by mass) of solid contents in the resist composition.

TABLE 3

| Resist composition | Resin | | Photoacid generator | | | Acid diffusion control agent | | Additive 1 | | Additive 2 | |
|---|---|---|---|---|---|---|---|---|---|---|---|
| | Type | Content | Type | Content | Ratio c [% by mass] | Type | Content | Type | Content | Type | Content |
| Resist 1 | A-1 | 83.71% | P-1 | 1.20% | 0.48 | Q-1 | 0.03% | X-1 | 15% | H-1 | 0.06% |
| Resist 2 | A-2 | 90.40% | P-2 | 2.50% | 0.83 | Q-2 | 0.10% | X-2 | 6.95% | X-4 | 0.05% |
| Resist 3 | A-3 | 97.15% | P-3 | 2.70% | 0.89 | Q-3 | 0.10% | — | — | H-1 | 0.05% |
| Resist 4 | A-4 | 87.65% | P-4 | 3.10% | 0.96 | Q-4 | 0.20% | X-3 | 9% | H-1 | 0.05% |
| Resist 5 | A-5 | 95.1% | P-5 | 4.5% | 1.58 | Q-4 | 0.3% | — | — | X-4 | 0.1% |
| Resist 6 | A-6 | 97% | P-1 | 2.90% | 0.81 | Q-2 | 0.10% | — | — | — | — |
| Resist 7 | A-7 | 88.67% | P-6 | 1.20% | 0.47 | Q-3 | 0.04% | X-2 | 10% | X-4 | 0.09% |
| Resist 8 | A-8 | 95.8% | P-7/P-8 | 1.0%/1.0% | 0.70 | Q-5 | 0.10% | X-5 | 2.00% | X-6 | 0.10% |
| Resist 9 | A-9 | 98.55% | P-9 | 1.20% | 0.34 | Q-6 | 0.20% | — | — | X-4 | 0.05% |
| Resist 10 | A-10 | 98.55% | P-10/P-11 | 0.6%/0.6% | 0.38 | Q-6 | 0.20% | — | — | H-1 | 0.05% |
| Resist 11 | A-11 | 98.60% | P-12/P-13 | 0.6%/0.6% | 0.32 | Q-6 | 0.20% | — | — | — | — |
| Resist 12 | A-12 | 97.80% | P-14 | 1.95% | 0.55 | Q-7 | 0.07% | X-7 | 0.09% | H-1 | 0.09% |
| Resist 13 | A-13/A-14 | 49.275%/49.275% | P-12/P-15 | 0.6%/0.6% | 0.38 | Q-2/Q-4 | 0.1%/0.1% | — | — | X-4 | 0.05% |
| Resist 14 | A-15/A-16 | 49.275%/49.275% | P-12/P-16 | 0.6%/0.6% | 0.38 | Q-4 | 0.20% | — | — | — | — |
| Resist 15 | A-17/A-18 | 49.275%/49.275% | P-2 | 1.20% | 0.38 | Q-6/Q-8 | 0.1%/0.1% | — | — | H-1 | 0.05% |
| Resist 16 | A-19 | 98.99% | P-17/P-18 | 0.50%/0.39% | 0.36 | Q-9 | 0.01% | X-8 | 0.01% | H-1 | 0.10% |
| Resist 17 | A-20 | 94.65% | P-19 | 4.00% | 0.36 | Q-1 | 0.30% | X-9 | 1.00% | X-4 | 0.05% |
| Ref Resist 18 | A-20 | 97.15% | P-19 | 1.00% | 0.09 | Q-1 | 0.30% | X-9 | 1.50% | X-4 | 0.05% |

| Resist composition | Solvent | Solid content | Forming condition | | | |
|---|---|---|---|---|---|---|
| | | | Film thickness | PB | PEB | Developer |
| Resist 1 | PGMEA/PGME (50/50) | 40% | 11.0 μm | 130° C./60 sec | 120° C./60 sec | TMAH (2.38%) |
| Resist 2 | PGMEA | 33% | 11.0 μm | 130° C./60 sec | 120° C./60 sec | TMAH (2.38%) |
| Resist 3 | PGMEA/PGME (70/30) | 33% | 11.0 μm | 130° C./60 sec | 120° C./60 sec | TMAH (2.38%) |
| Resist 4 | PGMEA/EL (80/20) | 31% | 11.0 μm | 130° C./60 sec | 120° C./60 sec | TMAH (2.38%) |
| Resist 5 | PGMEA/BA (50/50) | 35% | 7.5 μm | 110° C./60 sec | 110° C./60 sec | TMAH (2.38%) |
| Resist 6 | MAK/MMP (60/40) | 28% | 9.0 μm | 130° C./60 sec | 120° C./60 sec | TMAH (2.38%) |
| Resist 7 | PGMEA/PGME (50/50) | 39% | 11.0 μm | 130° C./60 sec | 120° C./60 sec | TMAH (2.38%) |
| Resist 8 | PGME/EL (70/30) | 35% | 8.0 μm | 150° C./60 sec | 110° C./60 sec | TMAH (2.38%) |
| Resist 9 | PGMEA/PGME (80/20) | 28% | 5.0 μm | 130° C./60 sec | 120° C./60 sec | TMAH (2.38%) |
| Resist 10 | PGMEA/PGME (80/20) | 32% | 10.0 μm | 130° C./60 sec | 120° C./60 sec | TMAH (2.38%) |
| Resist 11 | PGMEA/PGME (80/20) | 27% | 5.0 μm | 130° C./60 sec | 120° C./60 sec | TMAH (2.38%) |

TABLE 3-continued

|  | | | | | | |
|---|---|---|---|---|---|---|
| Resist 12 | PGMEA/PGME (20/80) | 28% | 5.0 μm | 140° C./ 60 sec | 110° C./ 60 sec | TMAH (2.38%) |
| Resist 13 | PGMEA/PGME (80/20) | 32% | 10.0 μm | 130° C./ 60 sec | 120° C./ 60 sec | TMAH (2.38%) |
| Resist 14 | PGMEA/PGME (80/20) | 32% | 10.0 μm | 130° C./ 60 sec | 120° C./ 60 sec | TMAH (2.38%) |
| Resist 15 | PGMEA/PGME (80/20) | 32% | 10.0 μm | 130° C./ 60 sec | 110° C./ 60 sec | TMAH (2.38%) |
| Resist 16 | PGMEA/PGME (50/50) | 40% | 11.0 μm | 140° C./ 90 sec | 120° C./ 90 sec | TMAH (2.38%) |
| Resist 17 | PGMEA/PGME (80/20) | 9% | 0.15 μm | 130° C./ 60 sec | 130° C./ 60 sec | TMAH (2.38%) |
| Ref Resist 18 | PGMEA/PGME (80/20) | 9% | 0.15 μm | 130° C./ 60 sec | 130° C./ 60 sec | TMAH (2.38%) |

<KrF Exposure Experiment>
(Pattern Formation 1)

Using a spin coater "ACT-8" manufactured by Tokyo Electron Limited, an antireflection film was not provided on a silicon wafer (8-inch diameter) treated with HMDS (hexamethyldisilazane), each of the resist compositions (resists 1 to 18) produced by the method was applied to the wafer and baked under a PB condition corresponding to each resist composition shown in Table 3, thereby forming each of resist films having a film thickness corresponding to each of the resist compositions shown in Table 3.

The obtained resist film was subjected to pattern exposure through a mask having a line-and-space pattern such that a space width and a pitch width of the pattern were 5 μm and 20 μm, respectively, using a KrF excimer laser scanner (manufactured by ASML; PAS5500/850C, wavelength 248 nm, NA=0.60, σ=0.75).

The resist film after exposure was baked under a PEB condition corresponding to each resist composition shown in Table 3, then developed with a developer corresponding to each resist composition shown in Table 3 for 30 seconds, and spin-dried to obtain an isolated space pattern having a space width of 5 μm and a pitch width of 20 μm.

Furthermore, a scanning electron microscope (938011 manufactured by Hitachi High-Technologies Corporation) was used for the measurement of a pattern size.

(Evaluation of Defects)

A defect distribution on a silicon wafer was detected using KLA2360 (manufactured by KLA Tencor), and a shape of the defect was observed using SEMVision G3 (manufactured by AMAT). Among the observed defects, the number of defects in a mode in which there was a dent in the pattern part and a mode in which the pattern edge part was missing was counted, and a defect generation density (count/cm$^2$) was totalized by dividing the number by a scanned area of the defect inspection and evaluated according to the following standard. The results are shown in Table 4.

~Evaluation Standard~

AAA: The density of defects generated is less than 0.02 counts/cm$^2$.

AA: The density of defects generated is 0.02 counts/cm$^2$ or more and less than 0.03 counts/cm$^2$.

A: The density of defects generated is 0.03 counts/cm$^2$ or more and less than 0.05 counts/cm$^2$.

B: The density of defects generated is 0.05 counts/cm$^2$ or more and less than 0.09 counts/cm$^2$.

C: The density of defects generated is 0.09 counts/cm$^2$ or more and less than 0.13 counts/cm$^2$.

D: The density of defects generated is 0.13 counts/cm$^2$ or more.

TABLE 4

|  | Resist composition | Ratio c [% by mass] | Right side of Expression (1) | Right side of Expression (2) | Stirring step | Ratio h | Evaluation of defects |
|---|---|---|---|---|---|---|---|
| Example 1 | Resist 1 | 0.48 | 0.40 | 0.22 | Stirring step J1 | 0.35 | C |
| Example 2 | Resist 1 | 0.48 | 0.40 | 0.22 | Stirring step J1 | 0.20 | B |
| Example 3 | Resist 1 | 0.48 | 0.40 | 0.22 | Stirring step J2 | 0.35 | B |
| Example 4 | Resist 1 | 0.48 | 0.40 | 0.22 | Stirring step J2 | 0.20 | B |
| Example 5 | Resist 1 | 0.48 | 0.40 | 0.22 | Stirring step J3 | 0.20 | AA |
| Example 6 | Resist 1 | 0.48 | 0.40 | 0.22 | Stirring step J4 | 0.20 | A |
| Example 7 | Resist 1 | 0.48 | 0.40 | 0.22 | Stirring step J5 | 0.20 | AA |
| Example 8 | Resist 1 | 0.48 | 0.40 | 0.22 | Stirring step J6 | 0.20 | A |
| Example 9 | Resist 1 | 0.48 | 0.40 | 0.22 | Stirring step J7 | 0.20 | AAA |
| Example 10 | Resist 5 | 1.58 | 0.16 | 0.10 | Stirring step J1 | 0.15 | C |
| Example 11 | Resist 5 | 1.58 | 0.16 | 0.10 | Stirring step J1 | 0.07 | B |
| Example 12 | Resist 17 | 0.36 | 0.45 | 0.25 | Stirring step J1 | 0.40 | C |
| Example 13 | Resist 17 | 0.36 | 0.45 | 0.25 | Stirring step J1 | 0.20 | B |
| Example 14 | Resist 2 | 0.83 | 0.29 | 0.17 | Stirring step J1 | 0.15 | B |
| Example 15 | Resist 3 | 0.89 | 0.27 | 0.16 | Stirring step J1 | 0.15 | B |
| Example 16 | Resist 4 | 0.96 | 0.26 | 0.15 | Stirring step J1 | 0.10 | B |
| Example 17 | Resist 6 | 0.81 | 0.29 | 0.17 | Stirring step J1 | 0.15 | B |
| Example 18 | Resist 7 | 0.47 | 0.40 | 0.23 | Stirring step J1 | 0.20 | B |
| Example 19 | Resist 8 | 0.70 | 0.32 | 0.19 | Stirring step J1 | 0.15 | B |
| Example 20 | Resist 9 | 0.34 | 0.47 | 0.26 | Stirring step J1 | 0.20 | B |
| Example 21 | Resist 10 | 0.38 | 0.44 | 0.25 | Stirring step J1 | 0.20 | B |
| Example 22 | Resist 11 | 0.32 | 0.48 | 0.26 | Stirring step J1 | 0.20 | B |
| Example 23 | Resist 12 | 0.55 | 0.37 | 0.21 | Stirring step J1 | 0.15 | B |

TABLE 4-continued

|  | Resist composition | Ratio c [% by mass] | Right side of Expression (1) | Right side of Expression (2) | Stirring step | Ratio h | Evaluation of defects |
|---|---|---|---|---|---|---|---|
| Example 24 | Resist 13 | 0.38 | 0.44 | 0.25 | Stirring step J1 | 0.20 | B |
| Example 25 | Resist 14 | 0.38 | 0.44 | 0.25 | Stirring step J1 | 0.20 | B |

TABLE 5

| Table 4 (continued) | Resist composition | Ratio c [% by mass] | Right side of Expression (1) | Right side of Expression (2) | Stirring step | Ratio h | Evaluation of defects |
|---|---|---|---|---|---|---|---|
| Example 26 | Resist 15 | 0.38 | 0.44 | 0.25 | Stirring step J1 | 0.20 | B |
| Example 27 | Resist 16 | 0.36 | 0.45 | 0.25 | Stirring step J1 | 0.10 | B |
| Example 28 | Resist 2 | 0.83 | 0.29 | 0.17 | Stirring step J7 | 0.15 | AAA |
| Example 29 | Resist 3 | 0.89 | 0.27 | 0.16 | Stirring step J7 | 0.15 | AAA |
| Example 30 | Resist 4 | 0.96 | 0.26 | 0.15 | Stirring step J7 | 0.10 | AAA |
| Example 31 | Resist 5 | 1.58 | 0.16 | 0.10 | Stirring step J7 | 0.07 | AAA |
| Example 32 | Resist 6 | 0.81 | 0.29 | 0.17 | Stirring step J7 | 0.15 | AAA |
| Example 33 | Resist 7 | 0.47 | 0.40 | 0.23 | Stirring step J7 | 0.20 | AAA |
| Example 34 | Resist 8 | 0.70 | 0.32 | 0.19 | Stirring step J7 | 0.15 | AAA |
| Example 35 | Resist 9 | 0.34 | 0.47 | 0.26 | Stirring step J7 | 0.20 | AAA |
| Example 36 | Resist 10 | 0.38 | 0.44 | 0.25 | Stirring step J7 | 0.20 | AAA |
| Example 37 | Resist 11 | 0.32 | 0.48 | 0.26 | Stirring step J7 | 0.20 | AAA |
| Example 38 | Resist 12 | 0.55 | 0.37 | 0.21 | Stirring step J7 | 0.15 | AAA |
| Example 39 | Resist 13 | 0.38 | 0.44 | 0.25 | Stirring step J7 | 0.20 | AAA |
| Example 40 | Resist 14 | 0.38 | 0.44 | 0.25 | Stirring step J7 | 0.20 | AAA |
| Example 41 | Resist 15 | 0.38 | 0.44 | 0.25 | Stirring step J7 | 0.20 | AAA |
| Example 42 | Resist 16 | 0.36 | 0.45 | 0.25 | Stirring step J7 | 0.10 | AAA |
| Example 43 | Resist 17 | 0.36 | 0.45 | 0.25 | Stirring step J7 | 0.20 | AAA |

TABLE 6

| Table 4 (continued) | Resist composition | Ratio c [% by mass] | Right side of Expression (1) | Right side of Expression (2) | Stirring step | Ratio h | Evaluation of defects |
|---|---|---|---|---|---|---|---|
| Comparative Example 1 | Resist 1 | 0.48 | 0.40 | 0.22 | Stirring step H1 | 0.20 | D |
| Comparative Example 2 | Resist 1 | 0.48 | 0.40 | 0.22 | Stirring step H2 | 0.20 | D |
| Comparative Example 3 | Resist 1 | 0.48 | 0.40 | 0.22 | Stirring step J1 | 0.45 | D |
| Comparative Example 4 | Resist 5 | 1.58 | 0.16 | 0.10 | Stirring step J1 | 0.20 | D |
| Comparative Example 5 | Resist 17 | 0.36 | 0.45 | 0.25 | Stirring step J1 | 0.50 | D |
| Comparative Example 6 | Resist 2 | 0.83 | 0.29 | 0.17 | Stirring step J1 | 0.35 | D |
| Comparative Example 7 | Resist 3 | 0.89 | 0.27 | 0.16 | Stirring step J1 | 0.35 | D |
| Comparative Example 8 | Resist 4 | 0.96 | 0.26 | 0.15 | Stirring step J1 | 0.35 | D |
| Comparative Example 9 | Resist 6 | 0.81 | 0.29 | 0.17 | Stirring step J1 | 0.35 | D |
| Comparative Example 10 | Resist 7 | 0.47 | 0.40 | 0.23 | Stirring step J1 | 0.45 | D |
| Comparative Example 11 | Resist 8 | 0.70 | 0.32 | 0.19 | Stirring step J1 | 0.35 | D |
| Comparative Example 12 | Resist 9 | 0.34 | 0.47 | 0.26 | Stirring step J1 | 0.50 | D |
| Comparative Example 13 | Resist 10 | 0.38 | 0.44 | 0.25 | Stirring step J1 | 0.50 | D |
| Comparative Example 14 | Resist 11 | 0.32 | 0.48 | 0.26 | Stirring step J1 | 0.50 | D |
| Comparative Example 15 | Resist 12 | 0.55 | 0.37 | 0.21 | Stirring step J1 | 0.40 | D |
| Comparative Example 16 | Resist 13 | 0.38 | 0.44 | 0.25 | Stirring step J1 | 0.50 | D |
| Comparative Example 17 | Resist 14 | 0.38 | 0.44 | 0.25 | Stirring step J1 | 0.50 | D |
| Comparative Example 18 | Resist 15 | 0.38 | 0.44 | 0.25 | Stirring step J1 | 0.50 | D |
| Reference Example 1 | Resist 18 | 0.09 | 0.73 | 0.39 | Stirring step J1 | 0.70 | B |
| Reference Example 2 | Resist 18 | 0.09 | 0.73 | 0.39 | Stirring step J1 | 0.50 | A |
| Reference Example 3 | Resist 18 | 0.09 | 0.73 | 0.39 | Stirring step J1 | 0.30 | AAA |
| Reference Example 4 | Resist 18 | 0.09 | 0.73 | 0.39 | Stirring step H1 | 0.70 | B |
| Reference Example 5 | Resist 18 | 0.09 | 0.73 | 0.39 | Stirring step H1 | 0.50 | A |
| Reference Example 6 | Resist 18 | 0.09 | 0.73 | 0.39 | Stirring step H1 | 0.30 | AAA |

As shown in Table 4, it was confirmed that a desired effect can be obtained by the production method of the embodiment of the present invention.

In a case where the ratio c of the content of the acid generator to the total mass of the mixture was less than 0.3% by mass, the effect of suppressing the pattern defects by the production method of the embodiment of the present invention could not be obtained (see Reference Examples 1 to 6).

In addition, it was confirmed that in a case where the stirrer satisfies Expression (2), the effect of the present invention is more excellent (comparison between Example 1 and Example 2, and the like).

It was confirmed that in a case where the stirrer satisfies Expression (3), the effect of the present invention is more excellent (comparison between Example 1 and Example 3).

It was confirmed that in a case where the angle α formed by the axial direction and the vertical direction of the stirring shaft is 1° or more and less than 35°, the effect of the present invention is more excellent (comparison between Example 4 and Example 5).

In addition, it was confirmed that in a case where the rotation speed of the stirring shaft is changed in the stirring step, the effect of the present invention is more excellent (comparison of Example 4, and Examples 6 and 7).

Above all, it was confirmed that in a case where the period in which the rotation speed of the stirring shaft is high and the period in which the rotation speed of the stirring shaft is slow are repeated in the stirring step, the effect of the present invention is more excellent, as compared with a method in which the period in which the stirring shaft is rotated and the period in which the rotation of the stirring shaft is stopped are repeated (comparison between Example 7 and Example 6).

In addition, it was confirmed that in a case where the baffle plate is provided on an inner peripheral surface of the stirring tank, the effect of the present invention is more excellent (comparison between Example 2 and Example 8).

EXPLANATION OF REFERENCES

10: stirring device
12: stirring tank
14: supply port
16: discharge port
18: baffle plate
20: stirring device
22: stirring shaft
24: support part
26: stirring element
28: tubular body
30: first opening portion
32: second opening portion
42: circulation pipe
44: filter
46: discharge pipe
48: discharge nozzle
100: production device

What is claimed is:

1. A method for producing a radiation-sensitive resin composition, the method being for producing a radiation-sensitive resin composition using a stirring device provided with a stirring tank and a stirrer, comprising:
a mixing step of charging a resin, an acid generator, and a solvent into the stirring tank to obtain a mixture including the resin, the acid generator, and the solvent; and
a stirring step of stirring the mixture accommodated in the stirring tank, using the stirrer,
wherein a mass ratio c of a content of the acid generator to a total mass of the mixture is 0.003 to 0.025 by mass,
the stirrer is provided with a rotatable stirring shaft, a plurality of support parts attached to the stirring shaft, and a plurality of stirring elements attached to each of end parts of the plurality of support parts,
the stirring element consists of a tubular body having a first opening portion and a second opening portion facing each other,
an opening area of the first opening portion is wider than an opening area of the second opening portion,
the stirring element is arranged such that a direction from the second opening portion to the first opening portion coincides with a rotation direction of the stirring shaft,
a central axis of the tubular body is inclined with respect to a plane orthogonal to the stirring shaft,
the stirrer satisfies Expression (1), $$h = h1/h2 \leq -0.2 \times \ln(c) + 0.25 \tag{1}$$

in Expression (1), h represents a ratio of an average value of depths from the plurality of stirring elements (h1) from a bottom of the stirring tank relative to a depth of a liquid level from the bottom of the stirring tank (h2) accommodated in the stirring tank, and ln(c) represents a natural logarithm of the ratio c,
a rotation speed of the stirring shaft is changed by repeating a period of rotating the stirring shaft and a period of stopping the rotation of the stirring shaft, or by repeating a plurality of periods having different rotation speeds including at least a period A having a relatively high rotation speed and a period B having a relatively slow rotation speed in the stirring step, and
the stirrer satisfies Expression (3), $$1/16 \leq d1/d2 \leq 3/8 \tag{3}$$

in Expression (3), d1 represents a distance between a point C1 located at a center of the plurality of stirring elements and a point C2 located at a center of an inner peripheral surface of the stirring tank in a case where the stirring device is observed from a vertical direction, and
d2 represents an inner diameter of the stirring tank in a cross-section of the stirring tank in a horizontal direction.

2. The method for producing a radiation-sensitive resin composition according to claim 1,
wherein a concentration of solid contents of the mixture is 10% by mass or more.

3. The method for producing a radiation-sensitive resin composition according to claim 1,
wherein the stirrer satisfies Expression (2), $$h = h1/h2 \leq -0.1 \times \ln(c) + 0.15 \tag{2}$$

in Expression (2), h and ln(c) have the same definitions as h and ln(c) in Expression (1).

4. The method for producing a radiation-sensitive resin composition according to claim 1,
wherein the stirring tank includes a baffle plate provided on an inner peripheral surface of the stirring tank.

5. A pattern forming method comprising:
forming a resist film on a substrate, by using a radiation-sensitive resin composition produced by the production method according to claim 1;
exposing the resist film; and
developing the exposed resist film by using a developer to form a pattern.

6. A method for producing a radiation-sensitive resin composition, the method being for producing a radiation-sensitive resin composition using a stirring device provided with a stirring tank and a stirrer, comprising:
a mixing step of charging a resin, an acid generator, and a solvent into the stirring tank to obtain a mixture including the resin, the acid generator, and the solvent; and
a stirring step of stirring the mixture accommodated in the stirring tank, using the stirrer,
wherein a mass ratio c of a content of the acid generator to a total mass of the mixture is 0.003 to 0.025 by mass,
the stirrer is provided with a rotatable stirring shaft, a plurality of support parts attached to the stirring shaft, and a plurality of stirring elements attached to each of end parts of the plurality of support parts,
the stirring element consists of a tubular body having a first opening portion and a second opening portion facing each other,
an opening area of the first opening portion is wider than an opening area of the second opening portion,
the stirring element is arranged such that a direction from the second opening portion to the first opening portion coincides with a rotation direction of the stirring shaft, a central axis of the tubular body is inclined with respect to a plane orthogonal to the stirring shaft, the stirrer satisfies Expression (1), $$h = h1/h2 \leq -0.2 \times \ln(c) + 0.25 \qquad (1)$$

in Expression (1), h represents a ratio of an average value of depths from the plurality of stirring elements (h1) from a bottom of the stirring tank relative to a depth of a liquid level from the bottom of the stirring tank (h2) accommodated in the stirring tank, and ln(c) represents a natural logarithm of the ratio c, a rotation speed of the stirring shaft is changed by repeating a period of rotating the stirring shaft and a period of stopping the rotation of the stirring shaft, or by repeating a plurality of periods having different rotation speeds including at least a period A having a relatively high rotation speed and a period B having a relatively slow rotation speed in the stirring step, and an angle formed by an axial direction and a vertical direction of the stirring shaft is 1° or more and less than 35°.

* * * * *